United States Patent
Lee et al.

(10) Patent No.: US 9,203,431 B2
(45) Date of Patent: Dec. 1, 2015

(54) LOW DENSITY PARITY CHECK (LDPC) ENCODING AND DECODING FOR SMALL TERMINAL APPLICATIONS

(71) Applicant: Hughes Network Systems, LLC, Germantown, MD (US)

(72) Inventors: Lin-Nan Lee, Potomac, MD (US); Mustafa Eroz, Germantown, MD (US); Liping Chen, Bethesda, MD (US)

(73) Assignee: Hughes Networks Systems, LLC, Germantown, MD (US)

( * ) Notice: Subject to any disclaimer, the term of this patent is extended or adjusted under 35 U.S.C. 154(b) by 74 days.

(21) Appl. No.: 14/214,740

(22) Filed: Mar. 15, 2014

(65) Prior Publication Data

US 2014/0331102 A1 Nov. 6, 2014

Related U.S. Application Data

(60) Provisional application No. 61/801,039, filed on Mar. 15, 2013.

(51) Int. Cl.
| | | |
|---|---|---|
| *H03M 13/00* | (2006.01) | |
| *H03M 13/11* | (2006.01) | |
| *H03M 13/03* | (2006.01) | |
| *H03M 13/25* | (2006.01) | |
| *H03M 13/27* | (2006.01) | |

(Continued)

(52) U.S. Cl.
CPC ........ *H03M 13/1105* (2013.01); *H03M 13/036* (2013.01); *H03M 13/1137* (2013.01); *H03M 13/1165* (2013.01); *H03M 13/255* (2013.01); *H03M 13/2707* (2013.01); *H03M 13/2906* (2013.01); *H03M 13/6566* (2013.01); *H03M 13/152* (2013.01)

(58) Field of Classification Search
CPC ............ H03M 13/09; H03M 13/1102; H03M 13/1111; H03M 13/112
USPC .................................................. 714/758, 759
See application file for complete search history.

(56) References Cited

U.S. PATENT DOCUMENTS

| | | |
|---|---|---|
| 5,805,642 A | 9/1998 | Wei et al. |
| 5,838,728 A | 11/1998 | Alamouti et al. |
| 5,844,943 A | 12/1998 | Kazecki et al. |

(Continued)

FOREIGN PATENT DOCUMENTS

| | | |
|---|---|---|
| EP | 1387496 A2 | 2/2004 |
| EP | 2365639 A2 | 9/2011 |
| WO | WO 2004/006442 A1 | 1/2004 |

OTHER PUBLICATIONS

EPO, "Extended European Search Report", EPO App. No. 14171484.0, Date: Oct. 30, 2014.

(Continued)

*Primary Examiner* — David Ton
(74) *Attorney, Agent, or Firm* — Potomac Technology Law, LLC

(57) ABSTRACT

Approaches are provided for closing communications channel links (e.g., for small terminal applications in satellite communications systems), at lower effective data rates, in a most power efficient manner, while still meeting regulatory requirements. Such approaches employ modulation and coding schemes that facilitate such lower effective data rates in a most power efficient manner. The new modulation and coding schemes include new low density parity check (LDPC) codes.

14 Claims, 13 Drawing Sheets

110

(51) Int. Cl.
*H03M 13/29* (2006.01)
*H03M 13/15* (2006.01)

(56) References Cited

U.S. PATENT DOCUMENTS

| | | | |
|---|---|---|---|
| 5,903,609 | A | 5/1999 | Kool et al. |
| 6,023,783 | A | 2/2000 | Divsalar et al. |
| 6,097,764 | A | 8/2000 | McCallister et al. |
| 6,104,761 | A | 8/2000 | McCallister et al. |
| 6,157,621 | A | 12/2000 | Brown et al. |
| 6,370,669 | B1 | 4/2002 | Eroz et al. |
| 6,430,722 | B1 | 8/2002 | Eroz et al. |
| 6,529,495 | B1 | 3/2003 | Aazhang et al. |
| 6,674,811 | B1 | 1/2004 | Desrosiers et al. |
| 6,724,813 | B1 | 4/2004 | Jamal et al. |
| 6,829,308 | B2 | 12/2004 | Eroz et al. |
| 6,940,827 | B2 | 9/2005 | Li et al. |
| 6,963,622 | B2 | 11/2005 | Eroz et al. |
| 7,020,829 | B2 | 3/2006 | Eroz et al. |
| 7,039,126 | B2 | 5/2006 | Galins |
| 7,173,978 | B2 | 2/2007 | Zhang et al. |
| 7,187,728 | B2 | 3/2007 | Seier et al. |
| 7,191,378 | B2 | 3/2007 | Eroz et al. |
| 7,203,887 | B2 | 4/2007 | Eroz et al. |
| 7,234,098 | B2 | 6/2007 | Eroz et al. |
| 7,237,174 | B2 | 6/2007 | Eroz et al. |
| 7,296,208 | B2 | 11/2007 | Sun et al. |
| 7,324,613 | B2 | 1/2008 | Fang et al. |
| 7,334,181 | B2 | 2/2008 | Eroz et al. |
| 7,376,883 | B2 | 5/2008 | Eroz et al. |
| 7,397,400 | B2 | 7/2008 | Miller |
| 7,398,455 | B2 | 7/2008 | Eroz et al. |
| 7,424,662 | B2 | 9/2008 | Eroz et al. |
| 7,430,396 | B2 | 9/2008 | Sun et al. |
| 7,447,984 | B2 | 11/2008 | Cameron et al. |
| 7,461,325 | B2 | 12/2008 | Eroz et al. |
| 7,483,496 | B2 | 1/2009 | Eroz et al. |
| 7,577,207 | B2 | 8/2009 | Eroz et al. |
| 7,673,226 | B2 | 3/2010 | Eroz et al. |
| 7,725,802 | B2 | 5/2010 | Eroz et al. |
| 7,746,758 | B2 | 6/2010 | Stolpman |
| 7,747,934 | B2 | 6/2010 | Livshitz |
| 7,770,089 | B2 | 8/2010 | Eroz et al. |
| 7,856,586 | B2 | 12/2010 | Eroz et al. |
| 7,864,869 | B2 | 1/2011 | Eroz et al. |
| 7,954,036 | B2 | 5/2011 | Eroz et al. |
| 7,962,830 | B2 | 6/2011 | Eroz et al. |
| 8,028,224 | B2 | 9/2011 | Eroz et al. |
| 8,069,393 | B2 | 11/2011 | Eroz et al. |
| 8,095,854 | B2 | 1/2012 | Eroz et al. |
| 8,102,947 | B2 | 1/2012 | Eroz et al. |
| 8,126,076 | B2 | 2/2012 | Sartori et al. |
| 8,140,931 | B2 | 3/2012 | Eroz et al. |
| 8,144,801 | B2 | 3/2012 | Eroz et al. |
| 8,145,980 | B2 | 3/2012 | Eroz et al. |
| 8,156,400 | B1 | 4/2012 | Yeo et al. |
| 8,181,085 | B2 | 5/2012 | Eroz et al. |
| 8,291,293 | B2 | 10/2012 | Eroz et al. |
| 8,369,448 | B2 | 2/2013 | Zhang et al. |
| 8,392,786 | B2 | 3/2013 | Trachewsky et al. |
| 8,402,341 | B2 | 3/2013 | Eroz et al. |
| 8,423,860 | B2 * | 4/2013 | Yang et al. ............... 714/752 |
| 8,782,499 | B2 | 7/2014 | Jeong et al. |
| 2003/0021358 | A1 | 1/2003 | Galins |
| 2003/0037298 | A1 | 2/2003 | Eleftheriou et al. |
| 2004/0019845 | A1 | 1/2004 | Eroz et al. |
| 2004/0054960 | A1 | 3/2004 | Eroz et al. |
| 2004/0258177 | A1 | 12/2004 | Shen et al. |
| 2005/0160351 | A1 * | 7/2005 | Ko et al. ............... 714/801 |
| 2006/0218459 | A1 | 9/2006 | Hedberg |
| 2006/0224935 | A1 | 10/2006 | Cameron et al. |
| 2008/0019263 | A1 | 1/2008 | Stolpman |
| 2008/0313523 | A1 | 12/2008 | Sun et al. |
| 2009/0158129 | A1 | 6/2009 | Myung et al. |
| 2009/0164863 | A1 | 6/2009 | Oh et al. |
| 2009/0187804 | A1 | 7/2009 | Shen et al. |
| 2009/0187811 | A1 | 7/2009 | Eroz et al. |
| 2009/0210767 | A1 * | 8/2009 | Myung et al. ............... 714/752 |
| 2009/0219849 | A1 | 9/2009 | Alpert et al. |
| 2009/0282314 | A1 | 11/2009 | Djordjevic et al. |
| 2010/0100789 | A1 | 4/2010 | Yu et al. |
| 2010/0122143 | A1 | 5/2010 | Lee et al. |
| 2010/0211841 | A1 | 8/2010 | Cao et al. |
| 2010/0241923 | A1 | 9/2010 | Wang et al. |
| 2011/0051825 | A1 | 3/2011 | Tao et al. |
| 2011/0138262 | A1 | 6/2011 | Myung et al. |
| 2011/0202820 | A1 | 8/2011 | Eroz et al. |
| 2011/0239086 | A1 | 9/2011 | Eroz et al. |
| 2013/0198581 | A1 | 8/2013 | Lee et al. |
| 2013/0283131 | A1 | 10/2013 | Tsatsaragkos et al. |
| 2014/0068375 | A1 | 3/2014 | Eroz et al. |

OTHER PUBLICATIONS

Hughes Network Systems, "DVB Part II: S2-Extensions (S2-X) Specification", XP017842249A, Oct. 21, 2013.
Hughes Network Systems, "DVB-S2 Annex M—S2-Extensions (S2-X) SPecification", XP017845061A, Oct. 7, 2013.
Hughes Network Systems, "DVB-S2 LDPC Codes for Very Low SNR Modes", XP017841241A, Jul. 22, 2013.
USPTO, "International Search Report & Written Opinion", PCT App. No. PCT/US2014/029939, Aug. 5, 2014.
Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, 13-17.
Eroz, Mustafa et al., "Structured Low-Density Parity-Check Code Design for Next Generation Digital Video Broadcast", Military Communications Conference, Oct. 17, 2005, XP010901536, 1-6.
ESR P1064EPOO, "European Search Report", EP 2365639 A3, Aug. 1, 2012.
ETSI EN 302 307 V1.2.1 (DVB), "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, 22-28, 37-49.

* cited by examiner

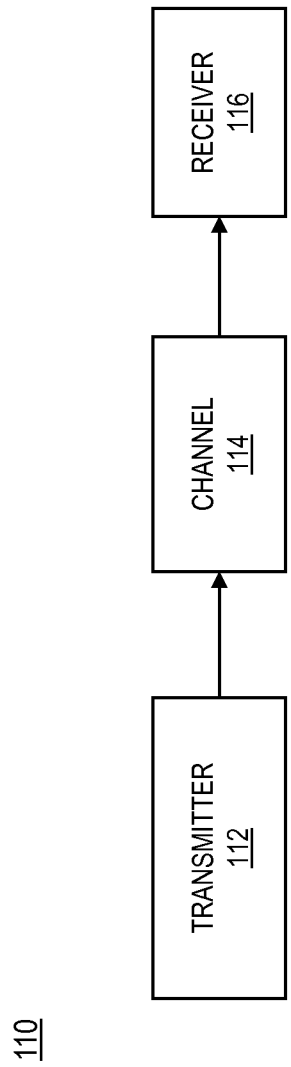

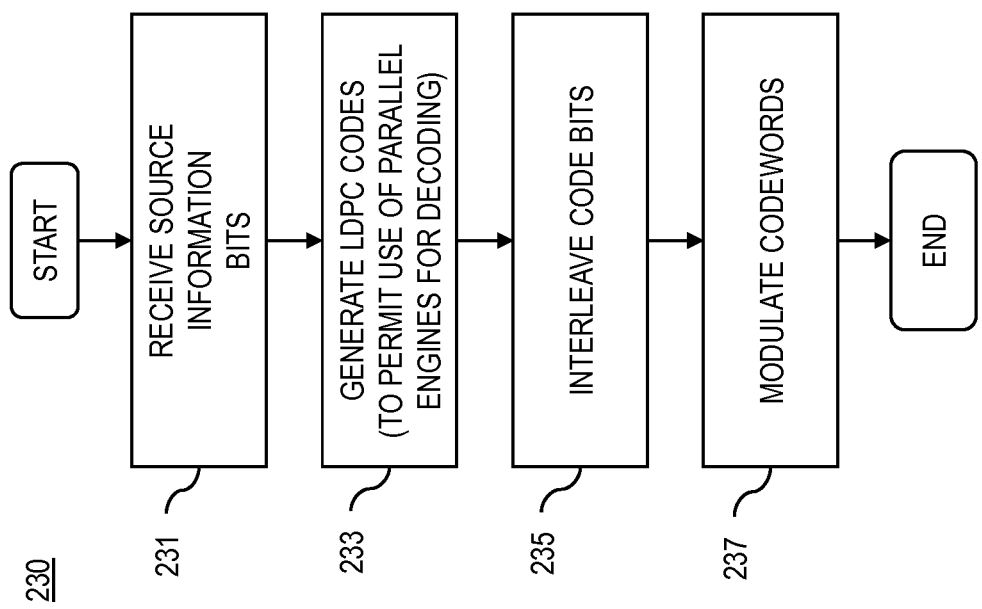

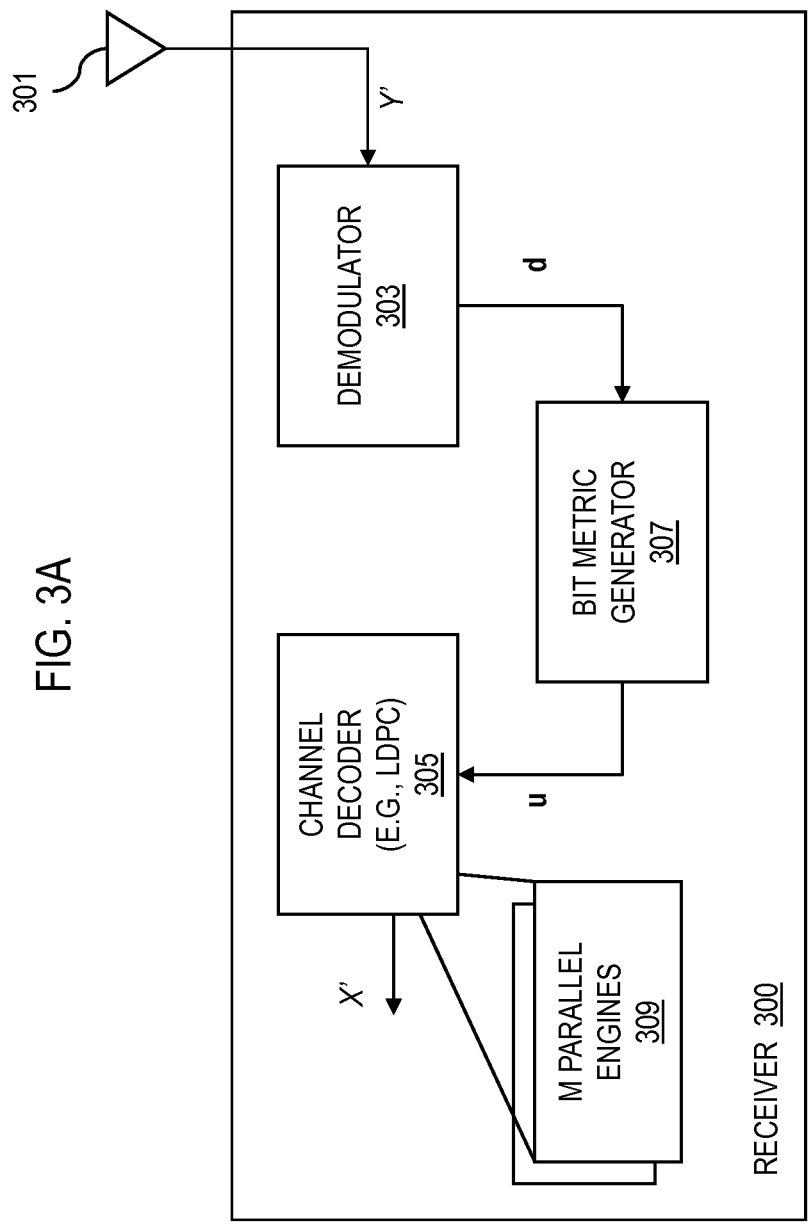

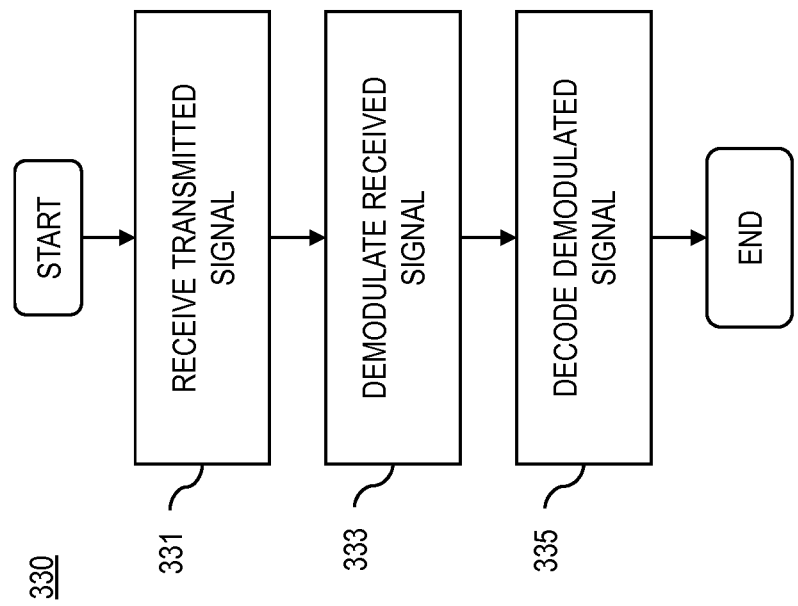

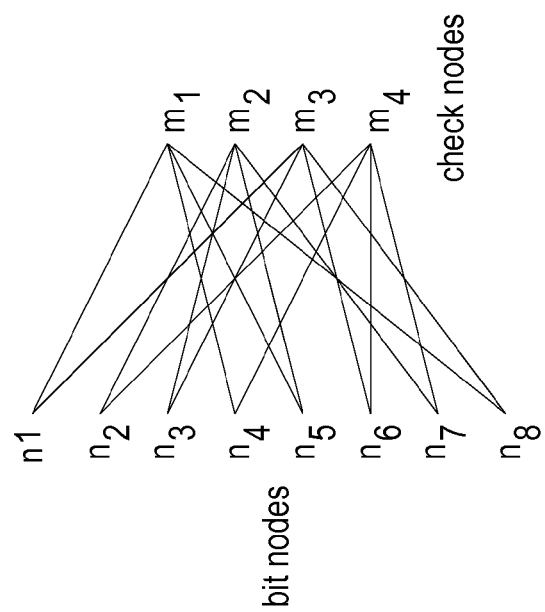

LOW DENSITY PARITY CHECK (LDPC) ENCODING AND DECODING FOR SMALL TERMINAL APPLICATIONS

RELATED APPLICATIONS

This application claims the benefit of the earlier filing date under 35 U.S.C. §119(e) of U.S. Provisional Application Ser. No. 61/801,039 (filed Mar. 15, 2013).

BACKGROUND

Communication systems employ coding to ensure reliable communication across noisy communication channels (e.g., satellite communications channels). These communication channels exhibit a fixed capacity that can be expressed in terms of bits per symbol at certain signal to noise ratio (SNR), defining a theoretical upper limit (known as the Shannon limit). The Shannon-Hartley theorem expresses the maximum rate at which information can be transmitted over a communications channel of a specified bandwidth in the presence of noise. As a result, coding design has aimed to achieve rates approaching this Shannon limit. One such class of codes that approach the Shannon limit is Low Density Parity Check (LDPC) codes.

In clear sky scenarios, the data transmission capability of a given satellite terminal depends on the power and antenna gain of the terminal antenna, and the capability of the satellite being used. For a typical small terminal, the data rate is limited by the satellite antenna gain over temperature, G/T. Higher data rates are supported by higher the G/T, and G/T depends on the satellite design, and location of the terminal within the coverage of the satellite. Higher data rates can also be achieved by using a higher power transmitter, or higher gain antenna at the terminal. By definition, however, antenna gain is limited for small antenna. Additionally, because of the wider beam-width of the small antenna, and the tight spacing of the satellites on the geosynchronous satellite orbit, small terminals must transmit their signal within an off-axis spectral density limit to ensure that they do not cause excessive interference to the adjacent satellites.

Further, both the Federal Communications Commission (FCC) and the U.S. and International Telecommunication Union (ITU) have set mask regulations in terms of angle from the antenna beam center. As a result, for a small terminal, the maximum transmit power in a given bandwidth cannot be exceeded due to such regulations. The regulations preclude the option of using higher transmit power to a satellite with lower G/T. For these cases, the only option to achieve reliable communications is to reduce the transmission data rate. When the transmission data rate is reduced, however, the occupied bandwidth of the signal is reduced accordingly. Hence, if a terminal is already using the maximum power allowed by the regulation, then reducing data rate would not provide any benefit.

Therefore, there is a need for an approach for closing communications channel links (e.g., for small terminal applications in satellite communications systems), at lower effective data rates, in a most power efficient manner, while still meeting regulatory requirements.

SOME EXAMPLE EMBODIMENTS

These and other needs are addressed by embodiments of the present invention, wherein approaches are provided for closing communications channel links (e.g., for small terminal applications in satellite communications systems), at lower effective data rates, in a most power efficient manner, while still meeting regulatory requirements.

According to an example embodiment, a method comprises encoding a source data sequence of information bits based on a predetermined structured parity check matrix of a Low Density Parity Check (LDPC) code, wherein the encoding is performed based on frames of the source data sequence, each frame being of a length of $k_{ldpc}$ information bits $(i_0, i_1, \ldots, i_{k_{ldpc}-1})$, and the output of the encoding comprises coded LDPC frames each being $n_{ldpc}$ coded bits in length. The structured parity check matrix is represented by tabular information (e.g., a code table) of a format wherein each row represents occurrences of one values within a respective column of the parity check matrix, and the columns of the parity check matrix are derived according to a predetermined operation based on the respective rows of the tabular information, and wherein the tabular information comprises one of a selection of new LDPC code designs (each represented by a respective code table).

According to a further example embodiment, an apparatus comprises at least one processor, and at least one memory including computer program code for one or more programs, wherein the at least one memory and the computer program code configured to, with the at least one processor, cause the apparatus to perform certain functions. A one function includes encoding a source data sequence of information bits based on a predetermined structured parity check matrix of a Low Density Parity Check (LDPC) code, wherein the encoding is performed based on frames of the source data sequence, each frame being of a length of $k_{ldpc}$ information bits $(i_0, i_1, \ldots, i_{k_{ldpc}-1})$, and the output of the encoding comprises coded LDPC frames each being $n_{ldpc}$ coded bits in length. The structured parity check matrix is represented by tabular information (e.g., a code table) of a format wherein each row represents occurrences of one values within a respective column of the parity check matrix, and the columns of the parity check matrix are derived according to a predetermined operation based on the respective rows of the tabular information, and wherein the tabular information comprises one of a selection of new LDPC code designs (each represented by a respective code table).

Still other aspects, features, and advantages of the present invention are readily apparent from the following detailed description, illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates a communications system capable of employing modulation and coding approaches, according to embodiments of the present invention;

FIG. 2B illustrates a flow chart depicting a process for performing encoding, interleaving and modulating source information bits, according to embodiments of the present invention;

FIG. 3A illustrates a block diagram depicting a receiver, according to embodiments of the present invention;

FIG. 3B illustrates a flow chart depicting a process for decoding an encoded signal, according to embodiments of the present invention;

FIG. 4 illustrates a sparse parity check matrix, according to embodiments of the present invention;

FIG. 5 illustrates a bipartite graph of an LDPC code of the matrix of FIG. 4, according to embodiments of the present invention;

FIG. 6 illustrates a sub-matrix of a sparse parity check matrix, according to embodiments of the present invention;

DESCRIPTION OF PREFERRED EMBODIMENTS

Figure 2A:
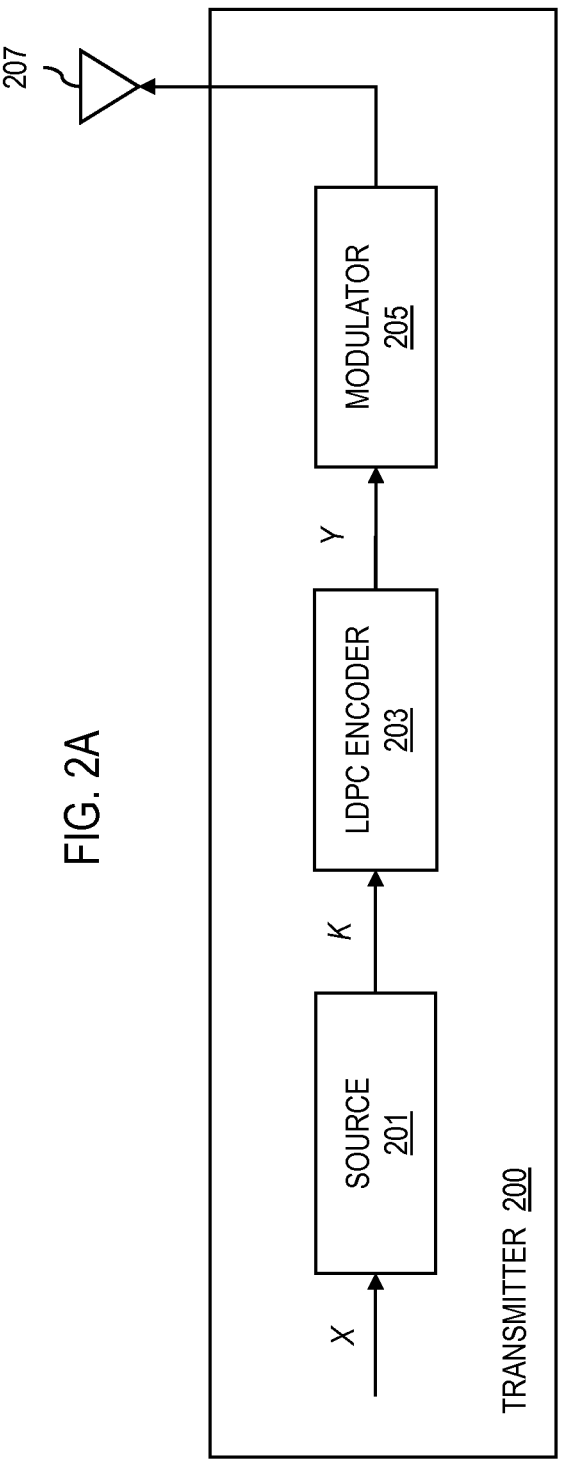
FIG. 2A illustrates a block diagram depicting a transmitter employing an LDPC encoder and a modulator, according to embodiments of the present invention.

Systems, methods and software systems, which facilitate closing communications channel links (e.g., in satellite communications systems), at lower effective data rates, in a most power efficient manner, while still meeting regulatory requirements, are herein described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

In accordance with example embodiments of the invention, a family of rate k/n low-density parity check (LDPC) codes of the same block length are applied, where k ranges from 1 up to n−1, and the effective data rate is directly scalable with k. Further, modulation schemes, such as Binary Phase Shifted Keying (BPSK), Quarternary Phase Shifted Keying (QPSK), or Offset Quaternary Phase Shifted Keying (OQPSK) may be applied. In one particular embodiment, a family of rate k/9 LDPC codes of block length 7200 bits, where k=6, 5, 4, 3, 2, 1 is provided. These codes encode 100 bytes, 200 bytes, and up to 600 bytes of information bits into one code block, and achieve rate performance very close to the Shannon limit (the theoretical the maximum transmission rate performance possible, over a communications channel in the presence of noise, for a given code rate). The encoders and decoders for these codes are also very simple to implement, using the same basic architecture. By adopting the transmission rates, a satellite terminal can move from the center of the beam to the edge of beam, while consistently transmitting close to the maximum data throughput rate, without ever changing the utilized power and bandwidth.

While the use of a family of multiple code rate LDPC codes of a common block length to provide different data rates at different power efficiencies is not new (e.g., the Digital Video Broadcast for Satellite, 2nd Generation (DVB-S2) encoding scheme), such existing approaches are constrained in that the code rates do not share a common denominator, which requires the block length to be the least common multiple of all the denominators. Embodiments of the present invention, however, are not restricted by such a constraint. Further, embodiments of the present invention are designed for transmission from small terminals with very small antennas, which are required to maintain operation within off-axis emission spectral density limitations, whereas emission spectral densities for DVB-S2 type coding schemes generally deal with fading in the downlink (because of the size of their antenna). Accordingly, embodiments of the present invention are well suited for transmission from a land, maritime or aeronautical mobile terminals, which typically use the maximum transmit power permitted by applicable regulations, where supportable data rates vary depending on the relative location of a satellite receiving beam, and the capabilities of the respective satellite.

According to further aspects of the present invention, the provided approaches address synchronization patterns that are introduced into the bit streams. Such synchronization patterns, for example, comprise a code block sync word (referred to as the unique word (UW)) that is inserted between code blocks, and pilot symbols inserted for maintenance of synchronization (e.g., inserted after the UW, with one pilot symbol inserted in every m symbols of the modulated). The UW is a special pattern that exhibits a good auto-correlation function, which allows the receiver to find the beginning of each code block quickly. UWs can also enable the receiver to set the automatic gain control and symbol timing recovery loop properly. When the modulation on the UW is removed, it provides an estimate of the carrier phase which provides a kick start of the carrier phase recovery loop for coherent demodulation of the coded data. The pilot symbol is a known modulated symbol that can refresh the carrier phase. By way of example, the length of the UW, and the spacing of the pilot symbols, is chosen to support the operating modes for the noisiest environment corresponding to a rate 1/9 code. According to one example, the UW word length for BPSK is two times of that for QPSK or O-QPSK, the pilot spacing for BPSK is half that for QPSK or O-QPSK. Accordingly, from the standpoint of percentage overhead, they are consistent for all modulation schemes. Additionally, the provided UW and pilot symbol approaches ensure the maintaining of synchronization while switching between any of the code rates.

Accordingly, embodiments of the present invention enable a very small satellite terminal to achieve reliable communication at a large range of transmission data rates within a fixed amount of bandwidth, at improved efficiencies. As specified above, small satellite terminals typically use as much power as possible to achieve maximum data rates, in view of their respective power amplifier specifications and the off-axis emission density limits imposed by applicable regulations. Further, approaches of the present invention further provide means to design the link using the most favorable satellite parameters, the size of the terminal antenna and the power amplifier specifications to find the maximum data rate supportable using minimum bandwidth, as required by applicable regulations, and to maximize performance of the modulation and coding schemes. Once the link design is determined, the user can adaptively reduce the data rates as needed when the terminal (e.g. a mobile terminal) moves towards the edge of a satellite beam or switches over to a satellite with different capabilities, without ever requiring rechecking off-axis emission spectral densities. Moreover, such approaches also apply to situations when the channel is degraded due to weather or partial blockage (e.g., due to foliage).

Accordingly, embodiments of the present invention significantly simplify link design for small mobile satellite terminals. The design approaches provide ways to provide information data rates at k times a basic rate, with a correspondingly simple user interface implementation, including providing clarity for the user with regard to expected data rates. By way of example, for small k (e.g., up to 5, for example), the degree of check node (which reflects an important measure of logic complexity of the decoder implementation), is also relatively small, leading to simpler implementation and/or faster decoding speeds. Further, according to aspects of the present invention, the total number of edges for low code rates is small, which reduces memory size requirements while increasing decoder throughput.

FIG. 1 illustrates a communications system capable of employing modulation and coding approaches, in accordance with example embodiments of the present invention. A digital communications system 110 includes a transmitter 112 that generates signal waveforms across a communication channel 114 to a receiver 116. In this discrete communications system 110, the transmitter 112 has a message source that produces a discrete set of possible messages; each of the possible messages has a corresponding signal waveform. These signal waveforms are attenuated, or otherwise altered, by communications channel 114. To combat the noise channel 114, LDPC codes are utilized. The LDPC codes that are generated by the transmitter 112 enable high speed implementation without incurring any performance loss. These structured LDPC codes output from the transmitter 112 avoid assignment of a small number of check nodes to the bit nodes already vulnerable to channel errors by virtue of the modulation scheme (e.g., quadrature phase-shift keying (QPSK), offset quadrature phase-shift keying (OQPSK), 8-PSK, 16 amplitude phase-shift keying (16-APSK), 32-APSK, etc.). Further, such LDPC codes have a parallelizable decoding algorithm (unlike turbo codes), which advantageously involves simple operations such as addition, comparison and table look-up. Moreover, carefully designed LDPC codes do not exhibit any sign of error floor. Additionally, according to one embodiment, the transmitter 112 generates, using a relatively simple encoding technique, LDPC codes based on parity check matrices (which facilitate efficient memory access during decoding) to communicate with the receiver 116. The transmitter 112 employs LDPC codes that can outperform concatenated turbo+RS (Reed-Solomon) codes, provided the block length is sufficiently large.

FIG. 2A illustrates a block diagram depicting a transmitter employing an LDPC encoder and a modulator, according to example embodiments of the present invention. As illustrated in FIG. 2A, a transmitter 200 can be equipped with an LDPC encoder 203 that accepts input from an information source 201 and outputs coded stream of higher redundancy suitable for error correction processing at the receiver 116. The information source 201 can generate K signals from a discrete alphabet, X. LDPC codes can be specified with parity check matrices. On the other hand, encoding LDPC codes may require, in general, specifying the generator matrices. Even though it is possible to obtain generator matrices from parity check matrices using Gaussian elimination, the resulting matrix is no longer sparse and storing a large generator matrix can be complex.

Encoder 203 generates signals from alphabet Y to a modulator 205 using a simple encoding technique that makes use of the parity check matrix by imposing structure onto the parity check matrix. According to certain embodiments, a restriction can be placed on the parity check matrix by constraining certain portion of the matrix to be triangular. The construction of such a parity check matrix is described more fully below in FIG. 6, which illustrates a sub-matrix of a sparse parity check matrix, according to an example embodiment of the present invention. Such a restriction can result in negligible performance loss, and therefore, constitutes an attractive trade-off. Modulator 205 maps the encoded messages from encoder 203 to signal waveforms that are transmitted to a transmit antenna 207, which emits these waveforms over the communication channel 114. Accordingly, the encoded messages are modulated and distributed to a transmit antenna 207. In certain example embodiments, the modulation can include Binary Phase Shifted Keying (BPSK), Quarternary Phase Shifted Keying (QPSK), or Offset Quaternary Phase Shifted Keying (OQPSK). According to further example embodiments, further modulation schemes are envisioned. The transmissions from the transmit antenna 207 propagate to a receiver, as discussed below.

With further respect to the LDPC coding, in accordance with example embodiments, the LDPC encoder systematically encodes an information block of size $k_{ldpc}$, $i=(i_0, i_1, \ldots, i_{k_{ldpc}-1})$ into a codeword of size $n_{ldpc}$, $c=(i_0, i_1, \ldots i_{k_{ldpc}-1}, p_0, p_1, \ldots, p_{n_{ldpc}-k_{ldpc}-1})$. The transmission of the codeword starts in the given order from $i_0$ and ends with $p_{n_{ldpc}-k_{ldpc}-1}$. In accordance with example embodiments of the present invention (e.g., for small terminal applications, such as mobile terminals), the relevant code rates and block sizes for the LDPC codes are specified in the following Table 1.

TABLE 1

LDPC Code Block Sizes

| Rate | Modulation | $k_{ldpc}$ | $n_{ldpc}$ |
|---|---|---|---|
| 1/9 | QPSK | 800 | 7200 |
| 2/9 | QPSK | 1600 | 7200 |
| 3/9 | QPSK | 2400 | 7200 |
| 4/9 | QPSK | 3200 | 7200 |
| 5/9 | QPSK | 4000 | 7200 |
| 6/9 | QPSK | 4800 | 7200 |

TABLE 2

M and q values

| Rate | M | q |
|---|---|---|
| 1/9 | 100 | 64 |
| 2/9 | 100 | 56 |
| 3/9 | 100 | 48 |
| 4/9 | 100 | 40 |
| 5/9 | 100 | 32 |
| 6/9 | 100 | 24 |

The task of the LDPC encoder is to determine $n_{ldpc}-k_{ldpc}$ parity bits $(p_0, p_1, \ldots p_{n_{ldpc}-k_{ldpc}-1})$ for every block of $k_{ldpc}$ information bits $(i_0, i_1, \ldots, i_{k_{ldpc}-1})$. For example, the LDPC encoding process can be summarized as follows:

(1) Initialize the parity bit accumulators $a_0=a_1= \ldots = a_{n_{ldpc}-k_{ldpc}-1}=0$;

(2) For the first information bit $i_0$, accumulate $i_0$ at the respective parity bit accumulators according to the accumulator addresses specified in the first row of the table for the respective code rate and block size ($n_{ldpc}$)—For example, Tables 3a through 3f (below). In other words, each accumulator address specifies the reference number (i) for the respective accumulator ($a_i$) at which the information bit is to be accumulated. For example, for rate 1/9 and block size N=7200 (Table 3a, below), the following operations are performed:

$a_{481} = a_{481} \oplus i_0$
$a_{2296} = a_{2296} \oplus i_0$
$a_{2997} = a_{2997} \oplus i_0$
$a_{3471} = a_{3471} \oplus i_0$
$a_{6042} = a_{6042} \oplus i_0$
$a_{1906} = a_{1906} \oplus i_0$
$a_{3776} = a_{3776} \oplus i_0$
$a_{661} = a_{661} \oplus i_0$
$a_{6132} = a_{6132} i_0$ (where all additions are in Galois Field (GF) 2 or modulo 2).

(3) For the next M−1 information bits $i_m$, (m=1, 2, ..., M−1), accumulate the information bits at the respective parity bit accumulators according to the accumulator addresses {x+m mod M*q} mod ($n_{ldpc}-k_{ldpc}$), where x denotes the address of the parity bit accumulator corresponding to the first bit $i_0$, M is the number of columns of a respective edge RAM, and $$q = \frac{n_{ldpc} - k_{ldpc}}{M}.$$

For example, M and q values are provided in the Table 2, above. Continuing with the rate 1/9 and block size N=7200 example (Table 3a), with M=100 and q=64, for information bit $i_1$, the following operations are performed:

$a_{545} = a_{545} \oplus i_1$
$a_{2360} = a_{2360} \oplus i_1$
$a_{3061} = a_{3061} \oplus i_1$
$a_{3535} = a_{3535} \oplus i_1$
$a_{6106} = a_{6106} \oplus i_1$
$a_{1970} = a_{1970} \oplus i_1$
$a_{3840} = a_{3840} \oplus i_1$
$a_{725} = a_{725} \oplus i_1$
$a_{6196} = a_{6196} \oplus i_1$ (where all additions are in GF (2)).

(4) For the (M+1)$^{st}$ information bit $i_M$, accumulate $i_M$ at the respective parity bit accumulators according to the accumulator addresses specified in the second row of the respective parity bit accumulator address table. Then, in a similar manner as in (3), for the next M−1 information bits $i_m$, (m=M+1, M+2, ..., 2M−1), accumulate the information bits at the respective parity bit accumulators according to the addresses {x+m mod M*q} mod ($n_{ldpc}-k_{ldpc}$), where x denotes the address of the parity bit accumulator corresponding to the information bit $i_M$ (e.g., based on the entries in the second row of the respective parity bit accumulator address table).

(5) In a similar manner, for every group of M new information bits, accumulate the information bits at the respective parity accumulators based on accumulator addresses obtained from a new row of the respective parity bit accumulator address table and the formula {x+m mod M*q} mod ($n_{ldpc}-k_{ldpc}$).

(6) After all of the information bits are exhausted, the final parity bits of the codeword are obtained as follows: (a) starting with i=1, sequentially perform the following operations with respect to the parity bit accumulators $a_i$, $a_i = a_i \oplus_{i-1}$, for i=1, 2, ..., $n_{ldpc}-k_{ldpc}-1$; and (b) the final content of the parity bits $p_i$ of the codeword c=($i_0$, $i_1$, ... $i_{k_{ldpc}-1}$, $p_0$, $p_1$, ..., $p_{n_{ldpc}-k_{ldpc}-1}$) are reflected by the resulting parity bit accumulators $a_i$, (i=0, 1, ..., $n_{ldpc}-k_{ldpc}-1$)

TABLE 3a

Address of Parity Bit Accumulators
(Rate 1/9, N = 7200)(Encoder)

481 2296 2997 3471 6042 1906 3776 661 6132
1538 4273 361 3175 2055 6040 924 6092 3272
25 1855 3580 4140 3368 37 4336 439 594
4192 1604 3152 2402 1146 2580 3629 5341 3498
1631 1029 3401
4541 4945 5399
2937 5709 2532
6273 5770 1519

TABLE 3b

Address of Parity Bit Accumulators
(Rate 2/9, N = 7200)(Encoder)

4557 3588 3053 538 1502 5541 2801
675 4275 1415 216 10 2497 5112
1615 1453 4656 2570 5189 4299 2737
28 4142 2786 1110 2249 4969 3866
1034 2067 2625 1368 3853 4311 4007
4492 466 275 2104 1145 4227 3937
5302 1029 1243 807 884 4743 3812
294 2895 2004 756 2445 3271 1870
4169 1411 3840
4654 3710 2684
3877 2448 3738
4933 3838 4778
484 2753 4431
3080 1024 2275
427 4202 646
4536 2135 2820

TABLE 3c

Address of Parity Bit Accumulators
(Rate 3/9, N = 7200)(Encoder)

1861 1874 3520 3810 1131 4520
4240 667 4548 4529 1593 3641
4334 2781 3360 2119 738 2254
3911 3674 1190 709 4191 3217
117 1009 1614 4367 3312 4406
2338 1288 2963 688 1468 2621
1374 1448 4186 1017 143 3197
4402 3009 4304 4295 984 4217
4238 3832 549 1644 2749 2678
1598 1520 1839 4743 157 1948
4179 1979 1719 1856 4418 2179
1617 1816 3506 4702 3483 4518
511 3674 2538 30 3511 3462
4602 1140 1658 1375 3286 3875
821 3597 4036 457 438 3454
3988 4006 1914 3859 2300 4164
2213 1347 265
2364 3896 1344
1554 3524 2530
4193 166 2314
491 346 940
4276 2940 4680
1556 2300 168
1124 4555 1916

TABLE 3d

Address of Parity Bit Accumulators
(Rate 4/9, N = 7200)(Encoder)

2008 293 3872 167 1594
3813 1424 609 2395 1506
1743 2092 224 713 2779
2637 1184 2116 2442 2654
3216 2706 834 303 715
3660 402 281 2267 2709
2370 196 2745 1440 1641
205 869 969 1602 2455
500 746 473 2083 401
2363 2407 949 3080 2798
2508 3754 1843 2140 3094
3718 3841 1840 1981 2912
2924 3635 3716 1694 1101
89 3706 3127 355 3277
2340 1983 1277 683 3085
2053 1470 1113 137 2126
112 2781 3480 290 3611
3845 2772 3135 1663 3785
3270 1519 1930 2507 1236
3416 3907 3181 3213 2139
2644 2211 1799 158 591
1137 2645 3858 3884 1113
1975 3732 3417 3942 2570
708 2151 2179 2776 2302
566 3070 2455
3982 191 3388
618 2748 318
3871 1898 456
3688 1818 1665
2785 768 79
2568 3851 2966
3086 1531 3230

TABLE 3e

Address of Parity Bit Accumulators
(Rate 5/9, N = 7200)(Encoder)

22 1372 2500 1497 3032
2824 723 2075 3183 3122
1608 713 1500 653 436
19 409 2086 1634 544
51 2956 270 1918 1201
1067 464 175 753 2110
2978 1416 102 2352 485
1446 1846 1934 939 2781
777 1330 2608 456 766
2861 228 1863 1248 2525
2606 453 2538 2844 1437
1044 1177 1047 98 2259
3128 193 2673 15 311
874 3060 78 2231 1979
21 1699 2487 712 1678
1802 3143 2051 3017 1052
205 3166 787 66 3077
2194 2314 3034 2344 1311
432 1679 1866 359 2476
807 817 534 3090 317
2916 724 2905 1484 2623
2697 373 901 1853 2019
1766 2373 1178 214 3089
1658 2786 1976 896 3199
737 1301 2300
1761 3195 476
1202 441 3081
1991 36 3008
2586 13 1120
1796 1883 2712
570 1407 2743
1630 3000 2811
504 1900 2512
2340 847 1718
2477 1798 1667
2356 1232 1411

TABLE 3e-continued

Address of Parity Bit Accumulators
(Rate 5/9, N = 7200)(Encoder)

971 1600 2271
853 1259 2932
629 140 929
321 1323 2508

TABLE 3f

Address of Parity Bit Accumulators
(Rate 6/9, N = 7200)(Encoder)

1748 1999 1640 1186 2169
1524 1385 355 1206 69
306 221 1341 1192 527
878 609 787 438 1841
359 1676 737 345 624
948 2037 2380 880 2010
1086 36 820 2297 635
496 1704 59 281 2334
1981 323 1318 1731 436
237 2198 418 13 1848
1973 106 142 1864 1155
424 2237 401 1990 2280
254 997 473 1799 102
1122 1894 1095 280 2177
2093 230 1495 1689 307
1872 1053 349 242 619
1965 1636 878 843 2305
1957 1869 2170 1491 1478
675 1521 2047 947 1346
374 405 746 639 2227
804 2296 853 2072 361
372 2259 2306 1867 479
191 558 1609 931 2196
372 1 681 1942 1388
2095 2127 1992
3 461 830
24 1069 1163
1033 822 1634
656 438 1503
721 135 2170
865 1419 1288
964 1453 1297
1536 2086 1100
1778 391 1291
1068 1655 365
410 419 1784
1949 1130 2095
2164 1338 236
1733 82 2038
1895 439 622
599 2338 2171
2047 642 260
868 572 800
1955 224 1329
2372 1818 56
656 594 2271
759 1426 1074
1852 1353 1671

FIG. 2B illustrates a flow chart depicting a process for performing encoding, interleaving and modulating source information bits, according to example embodiments of the present invention. At step 231 the information bits are received and LDPC codes are generated at step 233. It is noted that the structure of the LDPC codes (stemming from the design of the parity check matrix) permits an efficient decoding process, whereby parallel computation engines can be utilized. According to certain embodiments, the LDPC code can be generated without Bose Chaudhuri Hocquenghem (BCH) codes and codes also can contain a cyclical redundancy check (CRC) code. At step 235, the coded bits are altered by the interleaver 211, as described above. Next the codes are modulated per step 237 and are transmitted on the communication channel.

FIG. 3A illustrates a block diagram depicting a receiver, and FIG. 3B illustrates a flow chart depicting a process for decoding an encoded signal, according to example embodiments of the present invention. At the receiving side, a receiver 300 includes an antenna 301 that receives the waveforms emitted over the channel 114, which is depicted by step 331 where the receiver 300 receives the transmitted signal. The receiver provides a demodulator 303 that demodulates the received signal (Step 333). By way of example, the signal may reflect a source signal received at the receiver 200, encoded and modulated based on the example encoding and modulation schemes described herein, and transmitted over the channel 114. After demodulation, the received signals are forwarded to a decoder 305 for decoding the demodulated signal (Step 335). The decoder attempts to reconstruct the original source messages by generating messages, X', in conjunction with a bit metric generator 307. According to certain embodiments, the decoder 305 can employ M parallel engines 309 to efficiently decode the received signals. By way of example, according to this parallel approach, M may correspond to the groupings of M bit nodes for processing. In one example embodiment, the demodulator 303 in accordance with the bit metric generator 307 can provide a priori probabilities of log likelihood ratios of coded bits. It is contemplated that the above transmitter 200 and receiver 300 can be deployed within a single wireless terminal, in which case a common antenna system can be shared. The wireless terminal can for example be configured to operate within a satellite communication, a cellular system, wireless local area network (WLAN), etc. The LDPC codes, according to example embodiments, can be used to variety of digital video applications, such as MPEG (Motion Pictures Expert Group) packet transmission.

With respect to decoding the received LDPC encoded signals, LDPC codes reflect Lanier block codes with sparse parity check matrices $H_{(n-k) \times n}$. Typically the block length n ranges from thousands to tens of thousands of bits. As an example, FIG. 4 illustrates a sparse parity check matrix, for an LDPC code of length n=8 and rate 1/2. FIG. 5 illustrates a bipartite graph of an LDPC code of the matrix of FIG. 4, which connects each check equation (check node) to its participating bits (bit nodes). Parity check equations imply that for each check node, the sum (over Galois Field (GF) 2) of all adjacent bit nodes is equal to zero. As seen in the FIG. 5, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the purpose of the LDPC decoder 305 is to determine the transmitted values of the bits, where bit nodes and check nodes communicate with each other to determine the transmitted values. The decoding starts by assigning the channel values to the outgoing edges from bit nodes to check nodes, and then the check nodes make use of the parity check equations to update the bit node information and send it back. Each bit node then performs a soft majority vote among the information reaching it. At this point, if the hard decisions on the bits satisfy all of the parity check equations, then it is determined that a valid codeword has been found and the process stops. Otherwise, bit nodes go on sending the result of their soft majority votes to the check nodes. In the following clauses, we describe the decoding algorithm in detail. The number of edges adjacent to a node is called the degree of that node.

Further, the LDPC decoder 305 is considered a message passing decoder, whereby the decoder 305 aims to find the values of bit nodes. To accomplish this task, bit nodes and check nodes iteratively communicate with each other. The nature of this communication is described below. From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ would indicate to $n_1$ that the value of $n_1$ is believed to be 1. Additionally, for soft decision decoding, a reliability measure is added. From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of the value of $n_1$ is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 illustrates a diagram of a sub-matrix of a sparse parity check matrix, wherein the sub-matrix contains parity check values restricted to the lower triangular region, according to an example embodiment. As described previously, the encoder 203 (of FIG. 2) can employ a simple encoding technique by restricting the values of the lower triangular area of the parity check matrix. According to an example embodiment, the restriction imposed on the parity check matrix is of the form:

$$H_{(n-k) \times n} = [A_{(n-k) \times k} B_{(n-k) \times (n-k)}], \text{ where } B \text{ is the lower triangular.}$$

Any information block $i=(i_0, i_1, \ldots, i_{k-1})$ can be encoded to a codeword $c=(i_0, i_1, \ldots, i_{k-1}, p_0, p_1, \ldots, p_{n-k-1})$ using $Hc^T=0$, and recursively solving for parity bits, for example:

$$a_{00}i_0 + a_{01}i_1 + \ldots + a_{0,k-1}i_{k-1} + p_0 = 0 \Rightarrow \text{Solve } p_0$$

$$a_{10}i_0 + a_{11}i_1 + \ldots + a_{1,k-1}i_{k-1} + b_{10}p_0 + p_1 = 0 \Rightarrow \text{Solve } p_1$$

and similarly for $p_2, p_3, \ldots, p_{n-k-1}$.

Figure 7:
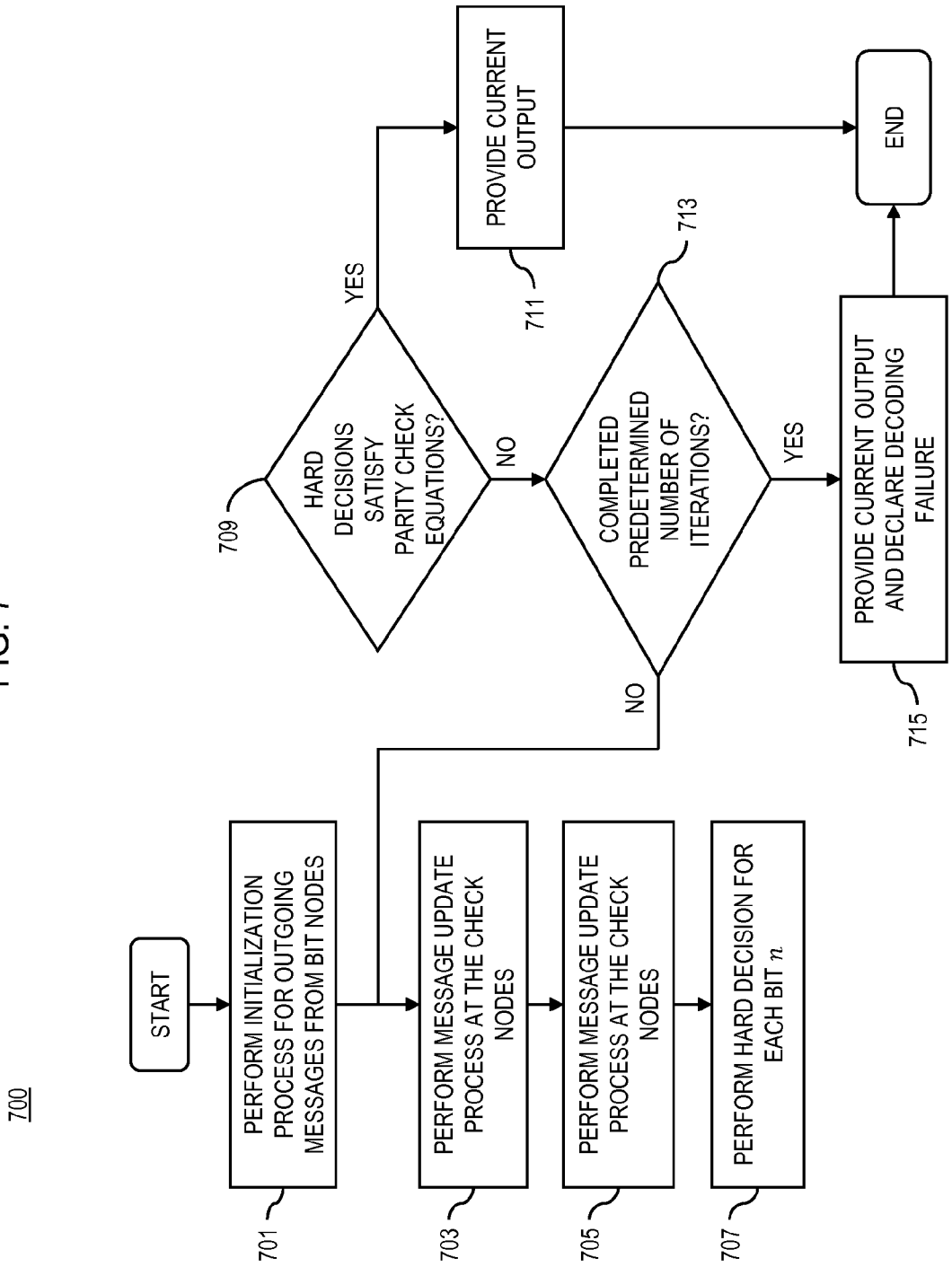
FIG. 7 illustrates a flowchart depicting a process for computing outgoing messages between check nodes and bit nodes, according to embodiments of the present invention.

FIG. 7 illustrates a flowchart depicting a decoding process 700 for computing outgoing messages between check nodes and bit nodes, according to embodiments of the present invention. According to example embodiments, the degree distribution of bit nodes is specified in the following Table 4:

TABLE 4

| Rate/Degree | 9 | 7 | 6 | 5 | 3 | 2 | 1 |
|---|---|---|---|---|---|---|---|
| 1/9 | 400 | | | | 400 | 6399 | 1 |
| 2/9 | | 800 | | | 800 | 5599 | 1 |
| 3/9 | | | 1600 | | 800 | 4799 | 1 |
| 4/9 | | | | 2400 | 800 | 3999 | 1 |
| 5/9 | | | | 2400 | 1600 | 3199 | 1 |
| 6/9 | | | | 2400 | 2400 | 2399 | 1 |

Table 4 illustrates the number of bit nodes exhibiting a specific degree (e.g., number of edges connected to the bit node), for each of the respective LDPC code rates. For example, from the first row for the table (Rate 1/9), 400 bit nodes have 9 connected outgoing edges, 400 bit nodes have 3 connected outgoing edges, 6399 bit nodes have 2 connected outgoing edges, and 1 bit node has only 1 connected outgoing edge. For the $n^{th}$ check node, the degree is 3, if n %8=0, 1, 2, 4, 5 or 7, otherwise the degree is 2 (rate 1/9 code). For the $n^{th}$ check node, the degree is 4, if n %7=0, 2 or 4, otherwise the degree is 3 (rate 2/9 code). For the $n^{th}$ check node, the degree is 5, if n %6=0, 2 or 4, otherwise the degree is 4 (rate 3/9 code). For the $n^{th}$ check node, the degree is 6, if n %5=0, 1 or 3, otherwise the degree is 5 (rate 4/9 code). For the $n^{th}$ check node, the degree is 8, if n %4=0, otherwise the degree is 7 (rate 5/9 code). For rate 6/9, the check node degree is always 10, except check node, n=0. One exception for all codes is that, for n=0, the check node degree is 2 (R=1/9), 3 (R=2/9), 4 (R=3/9), 5(R=4/9), 7(R=5/9), 9(R=6/9).

Figure 8A:
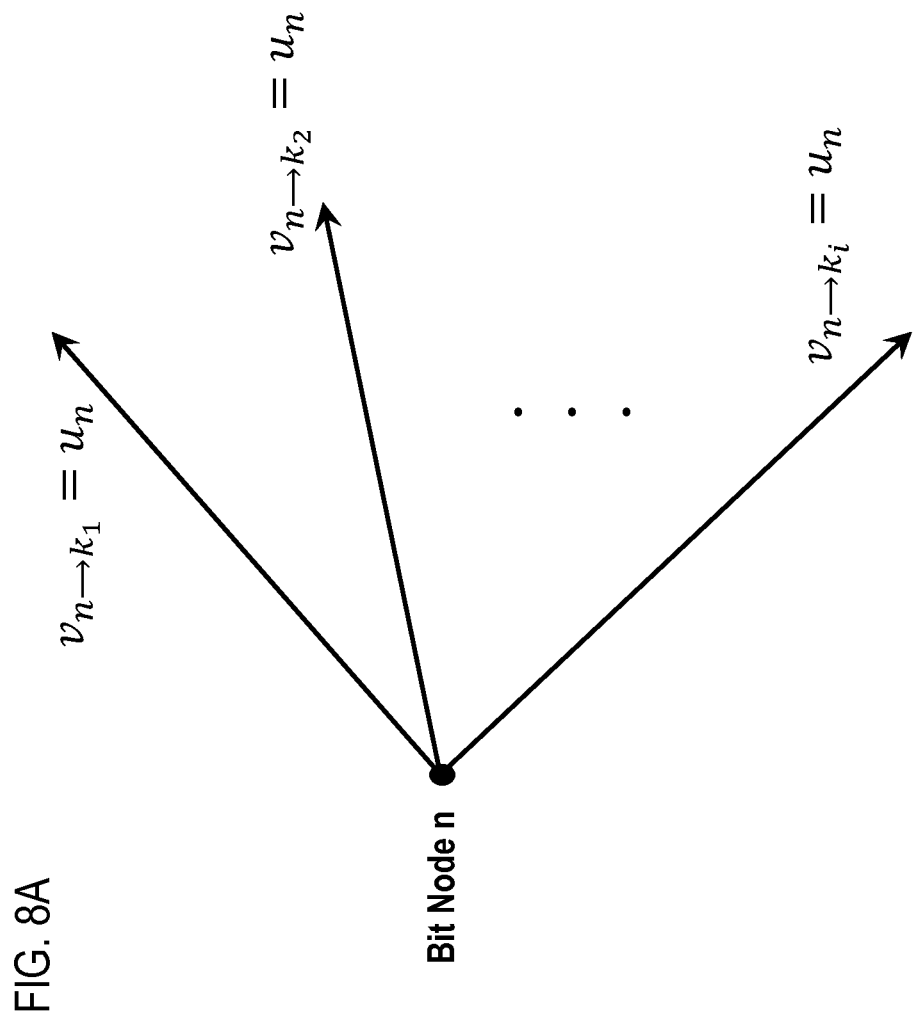
FIGS. 8A-8C illustrate diagrams depicting the interactions between check nodes and bit nodes in a decoding process, according to embodiments of the present invention.

FIG. 8A, illustrates a diagram reflecting the initialization process for outgoing messages from bit nodes (Step 701). For the initialization: $v_{n \to k_i} = u_n$, where n=0, 1, 2, ..., N−1 and i=1, 2, ..., deg(bit node n). Further, $v_{n \to k_i}$ reflects the message that goes from bit node n to its adjacent check node $k_i$, $u_n$ reflects the a-priori log-likelihood for the bit n, and N is the codeword length.

Figure 8B:
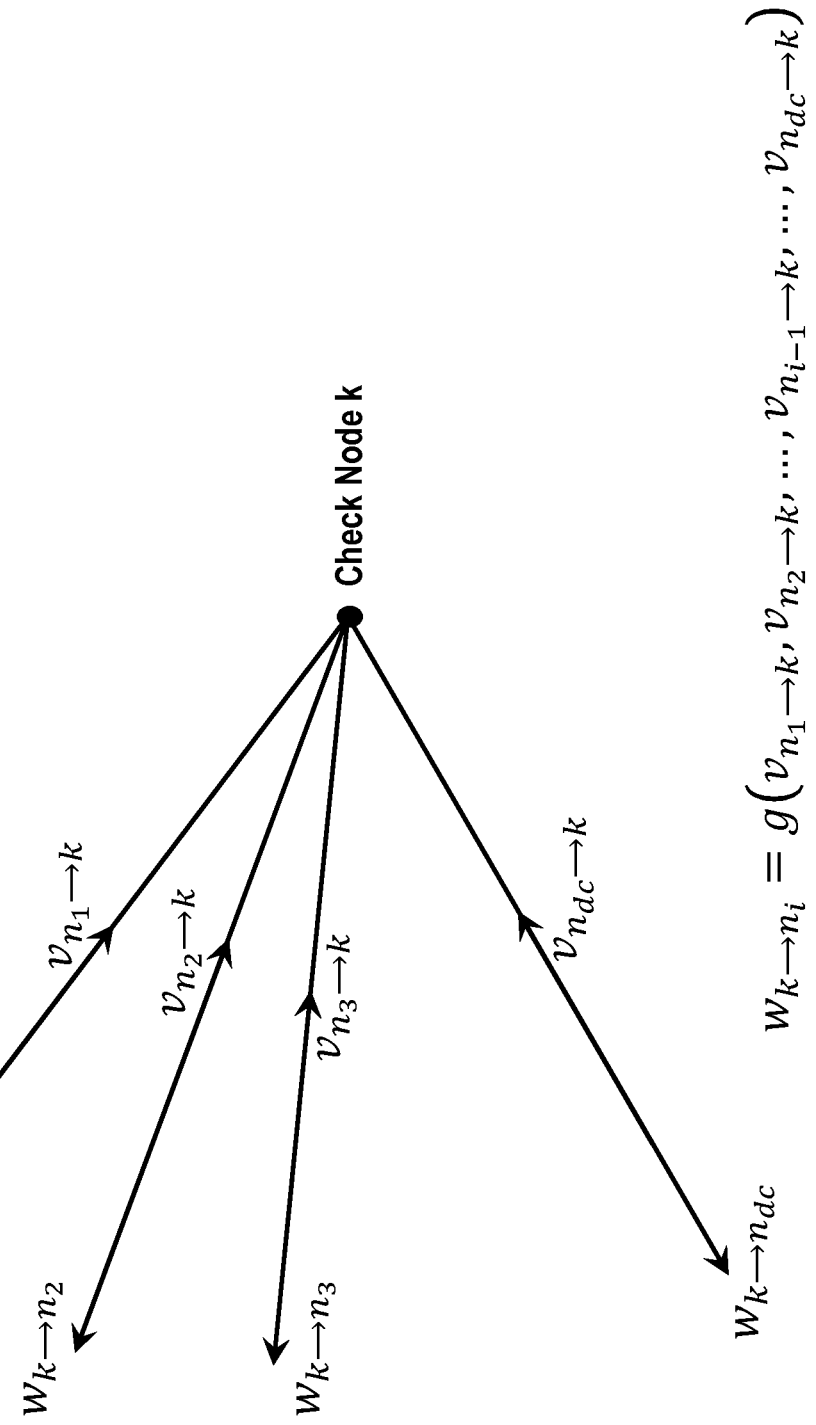

FIG. 8B, illustrates a diagram reflecting the process for message update at the check nodes (Step 703). Referring to FIG. 8B, the incoming messages to the check node k from its $d_c$ adjacent bit nodes is reflected by $v_{n_1 \to k}, v_{n_2 \to k}, \ldots, v_{n_{dc} \to k}$. The goal is to compute the outgoing messages from the check node k back to $d_c$ adjacent bit nodes. The outgoing messages are denoted by $w_{k \to n1}, w_{k \to n2}, \ldots, w_{k \to n_{dc}}$. Each outgoing message from check node k to its adjacent bit nodes is computed as:

$$w_{k \to n_i} = g(v_{n_1 \to k}, v_{n_2 \to k}, \ldots, v_{n_{i-1} \to k}, v_{n_{i+1} \to k}, \ldots, v_{n_{dc} \to k})$$

where $g(a,b) = \text{sign}(a) * \text{sign}(b) * \{\min(|a|,|b|)\} + LUT_g(a,b)$, and $$LUT_g(a,b) = \log(1+e^{-|a+b|}) - \log(1+e^{-|a-b|}).$$

In practice, $LUT_g(.)$ is implemented using a small look-up table. Also, it can be shown that the g (.) function with multiple inputs can be recursively computed—for example:

$$g(v_{n_1 \to k}, v_{n_2 \to k}, \ldots, v_{n_{i-1} \to k}, v_{n_{i+1} \to k}, v_{n_{dc} \to k}) = g(g(v_{n_1 \to k}, v_{n_2 \to k}, \ldots, v_{n_{i-1} \to k}, v_{n_{i+1} \to k}, \ldots, v_{n_{dc-1} \to k}), v_{n_{dc} \to k})$$

In accordance with further aspects of the present invention, a significantly simplified process is provided, with respect to low degree check nodes, for message update at the check nodes. By way of example, for low degree check nodes, the following simplified process can be performed:

(1) For check nodes of degree two:

$$w_{k \to n_1} = v_{n_2 \to k}$$

$$w_{k \to n_2} = v_{n_1 \to k}$$

(2) For check nodes of degree three:

$$w_{k \to n_1} = g(v_{n_2 \to k}, v_{n_3 \to k})$$

$$w_{k \to n_2} = g(v_{n_1 \to k}, v_{n_3 \to k})$$

$$w_{k \to n_3} = g(v_{n_1 \to k}, v_{n_2 \to k})$$

Figure 8C:
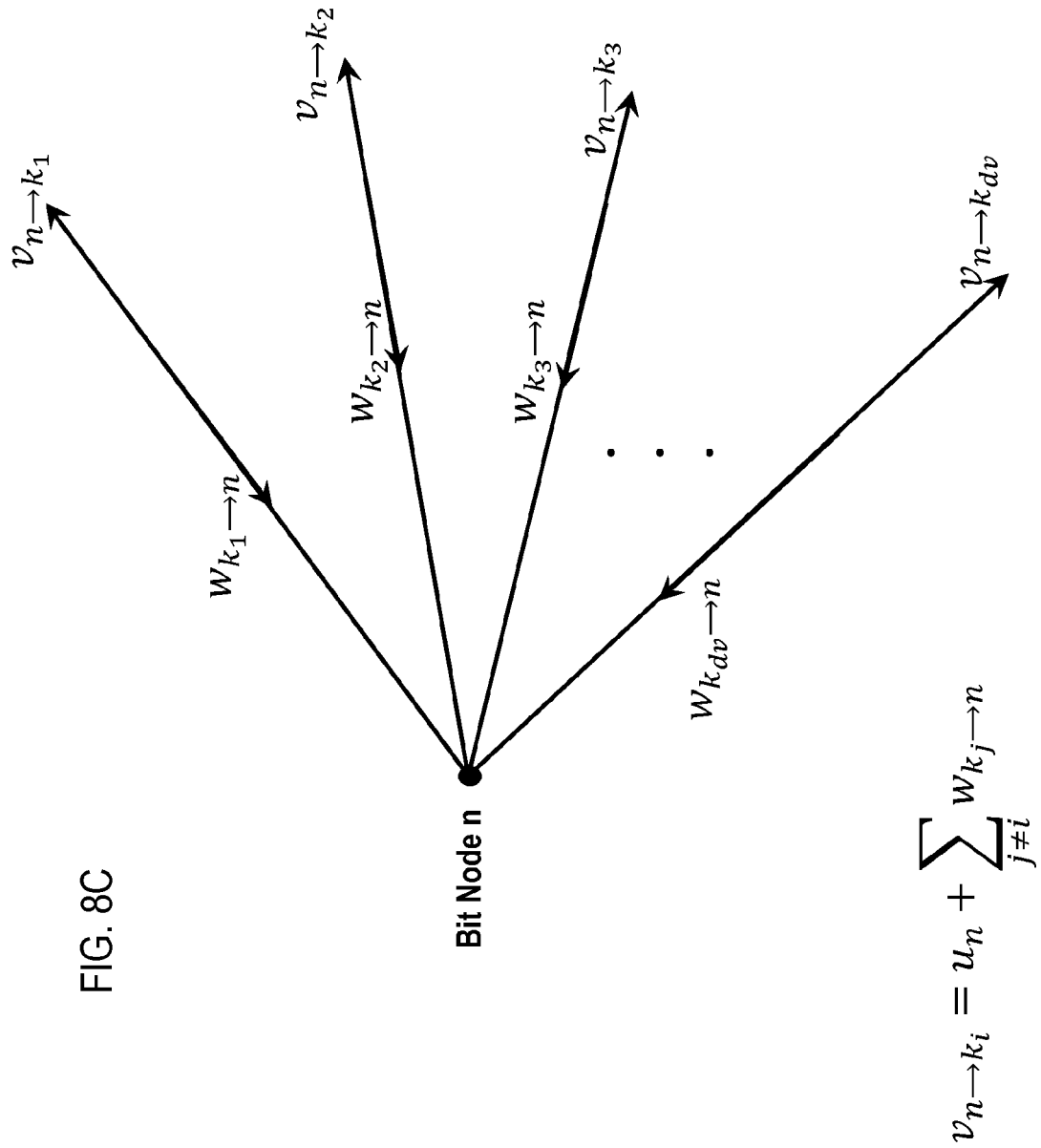

FIG. 8C, illustrates a diagram reflecting the process for message update at the bit nodes (Step 705). Referring to FIG. 8C, the incoming messages to the bit node n from its $d_v$ adjacent check nodes is reflected by $w_{k_1 \to n}, w_{k_2 \to n}, \ldots, w_{k_{dv} \to n}$. The goal is to compute the outgoing messages from the bit node n back to $d_v$ adjacent check nodes. The outgoing messages are denoted by $v_{n \to k_1}, v_{n \to k_2}, \ldots, n_{n \to k_{dv}}$. Each outgoing message from bit node n to its adjacent check nodes is computed as:

$$v_{n \to k_i} = u_n + \sum_{j \neq i} w_{k_j \to n}$$

After the check node and bit node updates (Steps 703 and 705, respectively), a hard decision can be made for each bit n by looking at the sign of $e_n + u_n$ (Step 707). It is then determined whether the hard decisions satisfy all the parity check equations (Step 709). If the determination is positive, then a valid codeword has been found and is output (Step 711). Otherwise, another check node/bit node update is performed. If no convergence is achieved after a pre-determined number of iterations (Step 713), the current output is provided and a decoding failure is declared (step 715).

According to further exemplary embodiments of the present invention, the provided approaches facilitate efficient memory access during check node and bit node processing. The values of the edges in the bipartite graph are stored in memory (e.g., RAM). According to one embodiment, for a truly random LDPC code, during check node and bit node processing, these values would need to be accessed one by one in a random fashion. Such an access scheme, however, would be too slow for a high data rate application. In that regard, approaches of the present invention provide a process facilitating the accessing of a large group of relevant edges in one clock cycle. By way of example, this approach is possible based on the placement these values "together" in memory. Traditionally, for a group of check nodes (respectively bit nodes) the relevant edges can readily be placed next to one another in memory, but then the relevant edges adjacent to a group of bit nodes (respectively check nodes) would be randomly scattered in the memory. Approaches of the present invention, therefore, ensure that the relevant edges for a group of bit nodes and check nodes are simultaneously placed together in the memory.

Figure 9A:
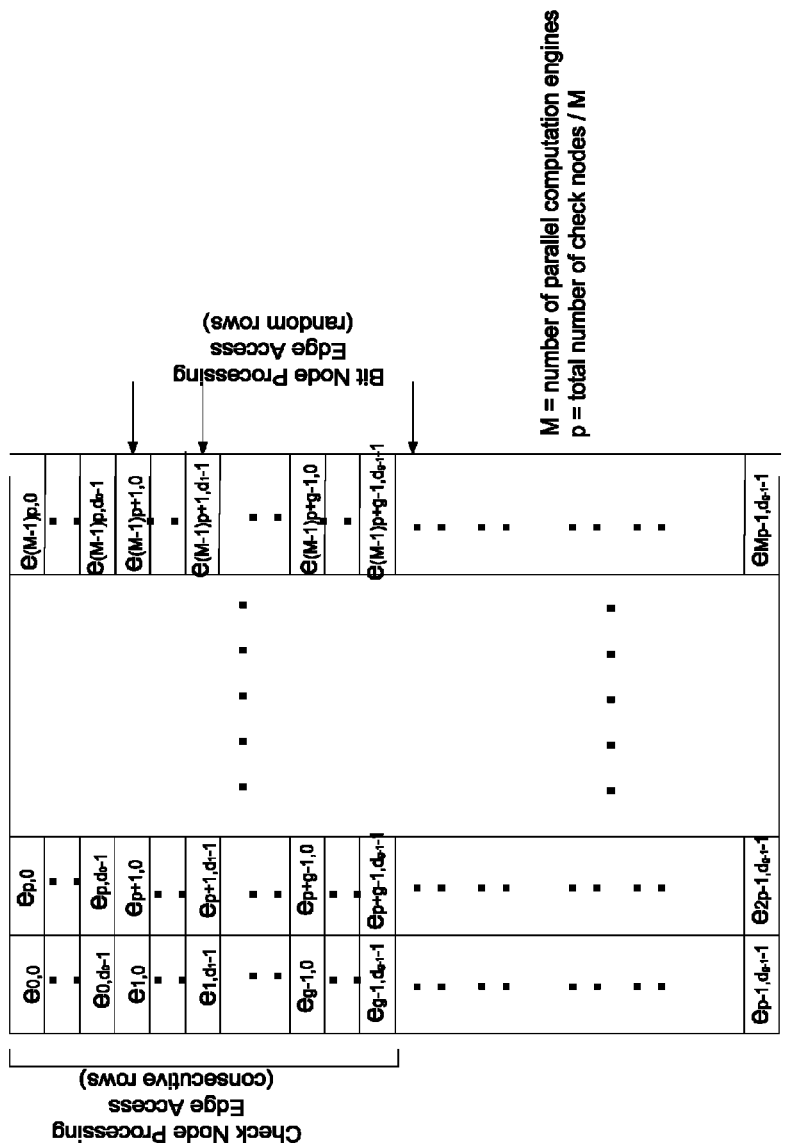
FIGS. 9A and 9B illustrate diagrams depicting the top edge and bottom edge of memory configurations for supporting efficient structured memory access, according to embodiments of the present invention.
Figure 9B:
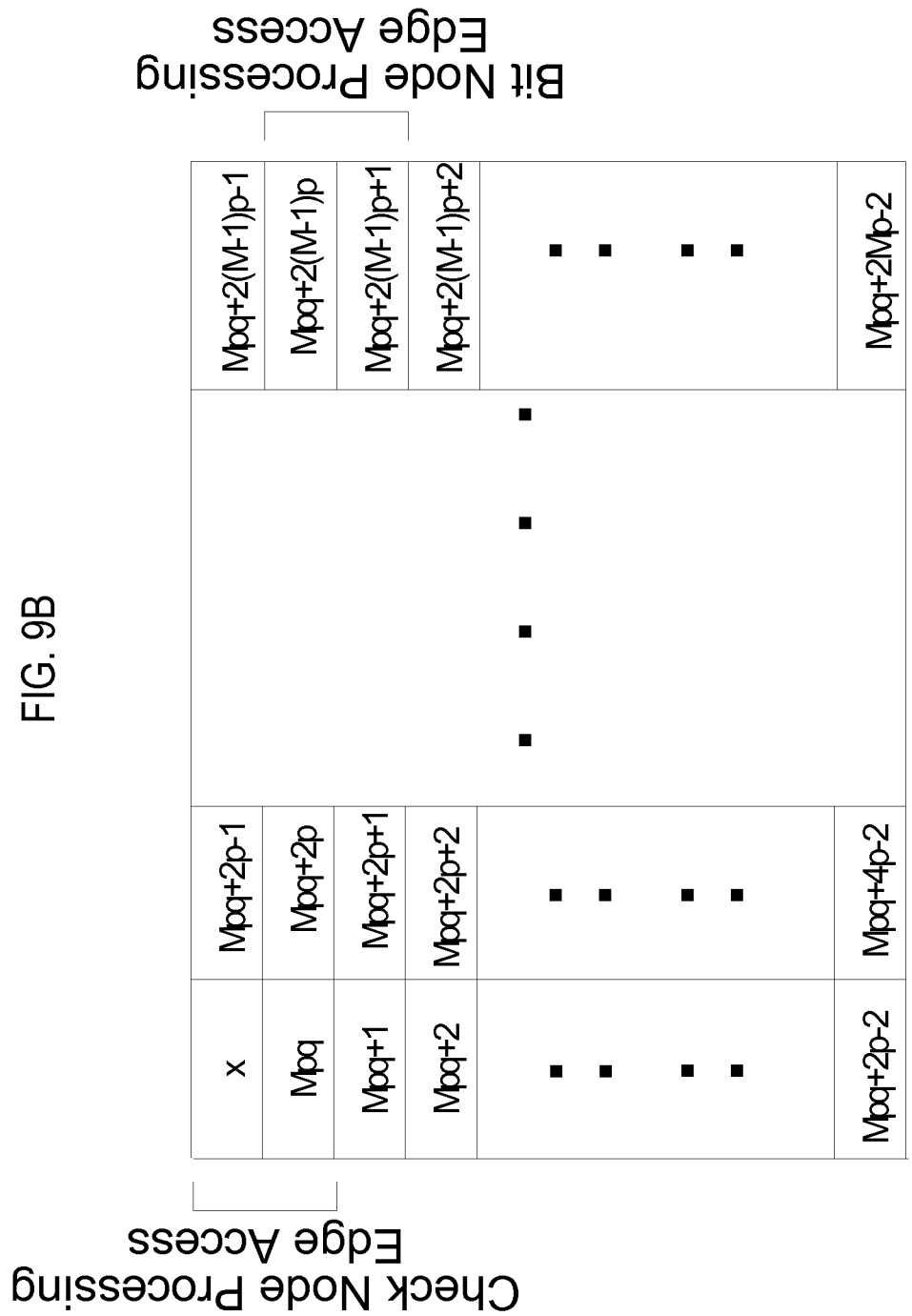

FIGS. 9A and 9B respectively illustrate diagrams depicting top edge and bottom edge memory configurations for supporting efficient structured memory access, according to embodiments of the present invention. FIG. 9A illustrates an example of the edge placement and access for top edge RAM, and FIG. 9B illustrates an example of the edge placement and access for bottom edge RAM. Each box in the figure contains the value of an edge. Edge RAM is conceptually divided into two parts, top edge RAM and bottom edge RAM (which, in practice form a single RAM). Bottom edge RAM contains the edges between parity bit nodes of degree 2 (or 1 for one single bit node) and check nodes. Top edge RAM contains the edges between information bit nodes and check nodes. For every check node, therefore, 2 adjacent edges are stored in the bottom RAM, and the rest of the edges are stored in the top edge RAM. The edges are consecutively placed in the top RAM column by column. For example, the edges $e_{0,0}, e_{0,1}, \ldots, e_{0,d_0-1}$ are adjacent edges to the check node 0, the edges $e_{1,0}, e_{1,1}, \ldots, e_{1,d_1-1}$ are adjacent edges to the check node 1, etc. The number of adjacent edges of top RAM per check node is periodic with a period of g. The size of the top edge RAM and bottom edge RAM for various code rates are specified in Table 5, below, and the period g of check nodes and the number of top RAM adjacent edges for these check nodes, for each code rate, are specified in Table 6, below. Further, in the edge RAM matrix, each entry will hold an edge value, stored with 8 bits. Bit nodes and check nodes are processed in groups of M=100 bit nodes and M=100 check nodes at a time, where M is equal to the number of columns in Table 5.

TABLE 5

Top Edge RAM and Bottom Edge RAM Dimensions

|  | 1/9 | 2/9 | 3/9 | 4/9 | 5/9 | 6/9 |
|---|---|---|---|---|---|---|
| Top Edge RAM | 48 × 100 | 80 × 100 | 120 × 100 | 144 × 100 | 168 × 100 | 192 × 100 |
| Bottom Edge RAM | 128 × 100 | 112 × 100 | 96 × 100 | 80 × 100 | 64 × 100 | 48 × 100 |

TABLE 6

Values of g and Number of Top RAM Edges of Check Nodes per Code Rate

|  | 1/9 | 2/9 | 3/9 | 4/9 | 5/9 | 6/9 |
|---|---|---|---|---|---|---|
| g | 8 | 7 | 6 | 5 | 4 | 1 |
| # adjacent edges | 1 1 1 0 1 1 0 1 | 2 1 2 1 2 1 1 | 3 2 3 2 3 2 | 4 4 3 4 3 | 6 5 5 5 | 8 |

By way of example, for bit node processing, if the group of M bit nodes are parity bit nodes, their edges are located in 2 consecutive rows of the bottom edge RAM. If the bit nodes are information bit nodes with degree $d_v$, then their edges are located in some $d_v$ rows of the top edge RAM. The address of these $d_v$ rows are stored in ROM. The edges in one of the rows correspond to the first edges of M bit nodes, the edges in another row correspond to the second edges of M bit nodes, etc. Further, for each row, the column index of the edge that belongs to the first bit node in the group of M is also stored in ROM. The edges that correspond to the second, third, etc. bit nodes follow the starting column index in a "wrapped around" fashion. For example, if the $j^{th}$ edge in the row belongs to the first bit node, then the $(j+1)^{st}$ edge belongs to the second bit node, the $(j+2)^{nd}$ edge belongs to the third bit node, . . . , and the $(j-1)^{st}$ edge belongs to the $M^{th}$ bit node.

In accordance with example embodiments, Tables 7a-7f we specify the row index and the starting column index of top edge RAM for every group of M information bit nodes. Each row in the tables represents a group of M bit nodes. The first number denotes the row index and the second number denotes the starting column index. For example, in Table 7a, the first row completely determines the addresses of adjacent edges for the first group of M=100 information bit nodes of degree 7. More precisely the entry 25/7 means that one adjacent edge per bit node for all of the 100 bit nodes are stored in row number 25. Further, in that row, the column indexed 7 carries the information for the adjacent edge of the first bit node, column indexed 8 carries the information for the adjacent edge of the second bit node, etc., and finally column indexed 6 carries the information for the adjacent edge of the $100^{th}$ bit node. Similarly the entry 42/35 means that another adjacent edge for all of the 100 bit nodes are stored in row number 42. Further, in that row, the column indexed 35 carries the information for the adjacent edge of the first bit node, column indexed 36 carries the information for the adjacent edge of the second bit node, etc., and finally column indexed 34 carries the information for the adjacent edge of the 100th bit node. In exactly the same manner, the entries in the second row of Table 7a determine the addresses of the adjacent edges for the second group of 100 bit nodes, etc.

TABLE 7a

Row Index/Starting Column Index
(Rate 1/9, N = 7200) (Decoder)

25/7 42/35 40/46 11/54 20/94 38/29 0/59 16/10 39/95
2/24 37/66 31/5 29/49 5/32 18/94 21/14 9/95 6/51
19/0 47/28 45/55 33/64 30/52 28/0 36/67 41/6 14/9
24/65 3/25 12/49 26/37 44/17 15/40 34/56 22/83 32/54
23/25 4/16 7/53
46/70 13/77 17/84
43/45 10/89 27/39
1/98 8/90 35/23

TABLE 7b

Row Index/Starting Column Index
(Rate 2/9, N = 7200) (Decoder)

30/81 6/64 42/54 49/9 66/26 76/98 2/50
5/12 28/76 22/25 69/3 15/0 48/44 23/91
68/28 77/25 12/83 72/45 53/92 62/76 70/48
40/0 78/73 60/49 67/19 13/40 59/88 3/69
38/18 73/36 71/46 35/24 65/68 79/76 45/71
18/80 26/8 74/4 46/37 36/20 39/75 25/70
55/94 31/18 16/22 33/14 63/15 56/84 7/68
20/5 57/51 64/35 41/13 54/43 34/58 32/33
37/74 17/25 47/68
9/83 21/66 75/47
19/69 58/43 61/66
8/88 43/68 27/85
52/8 14/49 10/79
0/55 24/18 50/40
51/7 4/75 44/11
1/81 11/38 29/50

TABLE 7c

Row Index/Starting Column Index
(Rate 3/9, N = 7200) (Decoder)

93/38 5/39 40/73 45/79 68/23 20/94
41/88 108/13 90/94 43/94 23/33 103/75
35/90 113/57 0/70 18/44 46/15 115/46
58/81 65/76 95/24 94/14 38/87 3/67
53/2 4/21 75/33 118/90 1/69 96/91
85/48 100/26 88/61 42/14 70/30 73/54
76/28 21/30 25/87 24/21 119/2 74/66
86/91 83/62 80/89 59/89 60/20 104/87
36/88 101/79 54/11 30/34 33/57 97/55
37/33 81/31 39/38 98/98 34/3 71/40
8/87 28/41 99/35 82/38 6/92 48/45
84/33 102/37 7/73 116/97 69/72 15/94
78/10 66/76 105/52 77/0 19/73 16/72
106/95 91/23 67/34 79/28 55/68 89/80
13/17 114/74 10/84 63/9 17/9 117/71
11/83 56/83 107/39 49/80 110/47 92/86
14/46 9/28 64/5
31/49 22/81 2/28
47/32 50/73 87/52
44/87 57/3 26/48
29/10 27/7 72/19
12/89 32/61 61/97
51/32 111/47 62/3
52/23 109/94 112/39

TABLE 7d

Row Index/Starting Column Index
(Rate 4/9, N = 7200) (Decoder)

29/50 47/7 116/96 26/4 123/39
48/95 87/35 33/15 126/59 94/37
83/43 44/52 88/5 119/17 69/69
134/65 89/29 130/52 8/61 51/66
58/80 95/67 124/20 84/7 127/17
72/91 9/10 4/7 98/56 105/67
36/59 131/4 90/68 0/36 5/41
18/5 106/21 34/24 10/40 54/61
73/12 96/18 120/11 11/52 6/10
12/59 27/60 107/23 1/77 137/69
101/62 125/93 13/46 74/53 52/77
138/92 7/96 2/46 76/49 117/72
15/73 128/90 132/92 53/42 77/27
35/2 97/92 28/78 129/8 135/81
75/58 85/49 136/31 14/17 19/77
49/51 108/36 121/27 62/3 22/53
118/2 78/69 3/87 37/7 40/90
20/96 45/69 55/78 86/41 91/94
109/81 141/37 38/48 99/62 133/30
59/85 100/97 79/79 50/80 70/53
16/66 41/55 142/44 139/3 112/14
63/28 21/66 65/96 17/97 122/27
56/49 46/93 64/85 80/98 39/64
102/17 113/53 71/54 60/69 81/57
23/14 110/76 57/61
82/99 114/4 103/84
66/15 104/68 140/7
115/96 67/47 61/11
30/92 68/45 92/41
93/69 31/19 143/1
32/64 42/96 24/74
25/77 43/38 111/80

TABLE 7e

Row Index/Starting Column Index
(Rate 5/9, N = 7200) (Decoder)

116/0 147/42 21/78 132/46 126/94
42/88 100/22 142/64 79/99 95/97
43/50 48/22 148/46 69/20 105/13
101/0 133/12 32/65 11/51 0/17
102/1 63/92 74/8 158/59 90/37
58/33 84/14 80/5 91/23 159/65
12/93 44/44 33/3 85/73 27/15
34/45 117/57 75/60 59/29 153/86
49/24 96/41 86/81 45/14 160/23
70/89 22/7 37/58 1/39 154/78
76/81 28/14 53/79 149/88 155/44
106/32 134/36 121/32 13/3 103/70
127/97 6/6 92/83 81/0 122/9
54/27 107/95 77/2 123/69 143/61
111/0 16/53 124/77 46/22 78/52
55/56 38/98 17/64 50/94 150/32
71/6 161/98 104/24 14/2 29/96
97/68 56/72 137/94 47/73 163/40
87/13 82/52 57/58 39/11 64/77
40/25 93/25 118/16 98/96 156/9
23/91 108/22 135/90 65/46 164/81
51/84 112/11 30/28 157/57 18/63
35/55 31/74 138/36 119/6 94/96
139/51 15/87 128/61 2/28 165/99
7/23 113/40 151/71
8/55 144/99 152/14
99/37 136/13 52/96
41/62 24/1 3/94
140/80 72/0 4/35
25/56 145/58 129/84
141/17 166/43 125/85
162/50 130/93 146/87
131/15 66/59 88/78
26/73 83/26 120/53
73/77 36/56 19/52
109/73 89/38 20/44

TABLE 7e-continued

Row Index/Starting Column Index
(Rate 5/9, N = 7200) (Decoder)

60/30 5/50 167/70
114/26 61/39 110/91
115/19 67/4 9/29
10/10 62/41 68/78

TABLE 7f

Row Index/Starting Column Index
(Rate 6/9, N = 7200) (Decoder)

160/72 56/83 64/68 80/49 72/90
96/63 136/57 152/14 48/50 168/2
144/12 40/9 169/55 128/49 184/21
112/36 73/25 153/32 49/18 137/76
185/14 161/69 138/30 74/14 0/26
97/39 170/84 32/99 129/36 145/83
50/45 98/1 33/34 139/95 88/26
130/20 1/71 89/2 140/11 51/97
104/82 90/13 176/54 24/72 34/18
171/9 113/91 81/17 105/0 2/77
41/82 82/4 177/5 131/77 25/48
132/17 42/93 141/16 178/82 3/95
114/10 106/41 142/19 186/74 52/4
146/46 179/78 120/45 133/11 143/90
43/87 115/9 57/62 75/70 154/12
4/78 172/43 107/14 16/10 155/25
173/81 35/68 116/36 26/35 8/96
108/81 174/77 83/90 27/62 117/61
28/28 76/63 58/85 91/39 17/56
118/15 175/16 18/31 121/26 156/92
99/33 134/95 109/35 65/86 9/15
100/15 29/94 19/96 157/77 187/19
188/7 53/23 10/67 158/38 101/91
102/15 11/0 77/28 180/80 162/57
59/87 122/88 5/83
30/0 44/19 119/34
6/1 110/44 92/48
12/43 54/34 20/68
66/27 55/18 123/62
13/30 124/5 84/90
14/36 31/59 135/53
36/40 111/60 15/54
7/64 181/86 163/45
21/74 60/16 159/53
103/44 189/68 45/15
22/17 93/17 67/74
46/81 23/47 61/87
37/90 147/55 164/9
47/72 85/3 182/84
190/78 62/18 183/25
191/24 86/97 94/90
63/85 148/26 165/10
38/36 166/23 68/33
95/81 69/9 78/55
167/98 149/75 70/2
71/27 150/24 125/94
126/31 87/59 151/44
39/77 79/56 127/69

Figure 10:
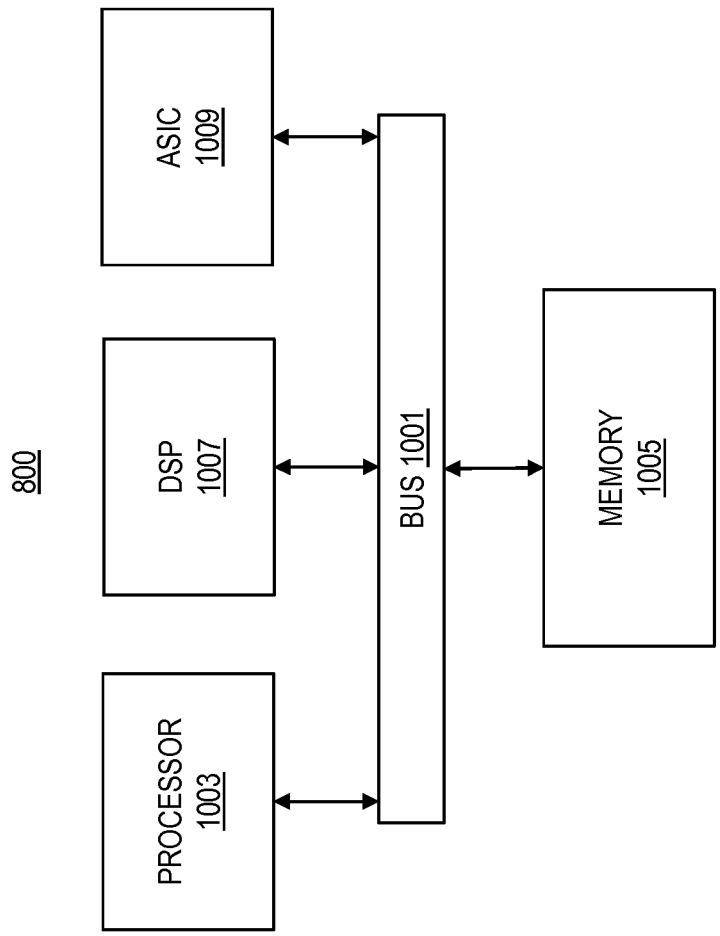
FIG. 10 illustrates a block diagram depicting a chip set that can be utilized in implementing example embodiments of the present invention.

FIG. 10 illustrates a block diagram depicting a chip set that can be utilized in implementing example embodiments of the present invention. With reference to FIG. 10, chip set 1000 includes, for instance, processor and memory components incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1000 includes a communication mechanism such as a bus 1001 for passing information among the components of the chip set. A processor 1003 has connectivity to the bus 1001 to execute instructions and process information stored in, for example, a memory 1005. The processor 1003 includes one or more processing cores with each core configured to perform independently. A multi-core processor enables multiprocessing within a single physical package. Examples of a multi-core processor include two, four, eight, or greater numbers of processing cores. Alternatively or in addition, the processor 503 includes one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, and/or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 may comprise various forms of computer-readable media, e.g., including both dynamic memory (e.g., RAM) and static memory (e.g., ROM) for storing executable instructions that, when executed by the processor 1003 and/or the DSP 1007 and/or the ASIC 1009, perform the process of example embodiments as described herein. The memory 1005 also stores the data associated with or generated by the execution of the process.

The term "computer-readable medium" or "computer-readable media," as used herein, refers to any medium that participates in providing instructions for execution by the processor 1003, and/or one or more of the specialized components, such as the one or more digital signal processors (DSP) 1007, and/or one or more application-specific integrated circuits (ASIC) 1009. Such a medium may take many forms, including but not limited to non-volatile media, volatile media, and transmission media. Non-volatile media include, for example, read only memory (ROM), included within memory 1005. Volatile media, for example, may include dynamic random access memory (RAM), included within memory 1005. Transmission media may include copper or other conductive wiring, fiber optics, or other physical transmission media, including the wires and/or optical fiber that comprise bus 1001. Transmission media can also take the form of wireless data signals, such as those generated during radio frequency (RF) and infrared (IR) data communications. Common forms of computer-readable media include, for example, magnetic storage media (e.g., magnetic hard disks or any other magnetic storage medium), solid state or semi-conductor storage media (e.g., RAM, PROM, EPROM, FLASH EPROM, a data storage device that uses integrated circuit assemblies as memory to store data persistently, or any other storage memory chip or module), optical storage media (e.g., CD ROM, CDRW, DVD, or any other optical storage medium), a or any other medium for storing data from which a computer or processor can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Moreover, as will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

While example embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
   encoding, by a processor of a device, a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 1a through 1f (below);

TABLE 1a

Address of Parity Bit Accumulators (Rate 1/9, N = 7200)

481 2296 2997 3471 6042 1906 3776 661 6132
1538 4273 361 3175 2055 6040 924 6092 3272
25 1855 3580 4140 3368 37 4336 439 594
4192 1604 3152 2402 1146 2580 3629 5341 3498
1631 1029 3401
4541 4945 5399
2937 5709 2532
6273 5770 1519

TABLE 1b

Address of Parity Bit Accumulators (Rate 2/9, N = 7200)

4557 3588 3053 538 1502 5541 2801
675 4275 1415 216 10 2497 5112
1615 1453 4656 2570 5189 4299 2737
28 4142 2786 1110 2249 4969 3866
1034 2067 2625 1368 3853 4311 4007
4492 466 275 2104 1145 4227 3937
5302 1029 1243 807 884 4743 3812
294 2895 2004 756 2445 3271 1870
4169 1411 3840
4654 3710 2684
3877 2448 3738
4933 3838 4778
484 2753 4431
3080 1024 2275
427 4202 646
4536 2135 2820

TABLE 1c

Address of Parity Bit Accumulators (Rate 3/9, N = 7200)

1861 1874 3520 3810 1131 4520
4240 667 4548 4529 1593 3641
4334 2781 3360 2119 738 2254
3911 3674 1190 709 4191 3217
117 1009 1614 4367 3312 4406
2338 1288 2963 688 1468 2621
1374 1448 4186 1017 143 3197
4402 3009 4304 4295 984 4217
4238 3832 549 1644 2749 2678
1598 1520 1839 4743 157 1948
4179 1979 1719 1856 4418 2179
1617 1816 3506 4702 3483 4518
511 3674 2538 30 3511 3462
4602 1140 1658 1375 3286 3875
821 3597 4036 457 438 3454
3988 4006 1914 3859 2300 4164
2213 1347 265
2364 3896 1344
1554 3524 2530
4193 166 2314
491 346 940
4276 2940 4680
1556 2300 168
1124 4555 1916

TABLE 1d

Address of Parity Bit Accumulators (Rate 4/9, N = 7200)

2008 293 3872 167 1594
3813 1424 609 2395 1506
1743 2092 224 713 2779
2637 1184 2116 2442 2654
3216 2706 834 303 715
3660 402 281 2267 2709
2370 196 2745 1440 1641
205 869 969 1602 2455
500 746 473 2083 401
2363 2407 949 3080 2798
2508 3754 1843 2140 3094
3718 3841 1840 1981 2912
2924 3635 3716 1694 1101
89 3706 3127 355 3277
2340 1983 1277 683 3085
2053 1470 1113 137 2126
112 2781 3480 290 3611
3845 2772 3135 1663 3785
3270 1519 1930 2507 1236
3416 3907 3181 3213 2139
2644 2211 1799 158 591
1137 2645 3858 3884 1113
1975 3732 3417 3942 2570
708 2151 2179 2776 2302
566 3070 2455
3982 191 3388
618 2748 318
3871 1898 456
3688 1818 1665
2785 768 79
2568 3851 2966
3086 1531 3230

TABLE 1e

Address of Parity Bit Accumulators (Rate 5/9, N = 7200)

22 1372 2500 1497 3032
2824 723 2075 3183 3122
1608 713 1500 653 436
19 409 2086 1634 544
51 2956 270 1918 1201
1067 464 175 753 2110
2978 1416 102 2352 485
1446 1846 1934 939 2781
777 1330 2608 456 766
2861 228 1863 1248 2525
2606 453 2538 2844 1437
1044 1177 1047 98 2259
3128 193 2673 15 311
874 3060 78 2231 1979
21 1699 2487 712 1678
1802 3143 2051 3017 1052
205 3166 787 66 3077
2194 2314 3034 2344 1311
432 1679 1866 359 2476
807 817 534 3090 317
2916 724 2905 1484 2623
2697 373 901 1853 2019
1766 2373 1178 214 3089
1658 2786 1976 896 3199
737 1301 2300
1761 3195 476
1202 441 3081
1991 36 3008
2586 13 1120
1796 1883 2712
570 1407 2743
1630 3000 2811
504 1900 2512
2340 847 1718
2477 1798 1667
2356 1232 1411

TABLE 1e-continued

Address of Parity Bit Accumulators
(Rate 5/9, N = 7200)

971 1600 2271
853 1259 2932
629 140 929
321 1323 2508

TABLE 1f

Address of Parity Bit Accumulators
(Rate 6/9, N = 7200)

1748 1999 1640 1186 2169
1524 1385 355 1206 69
306 221 1341 1192 527
878 609 787 438 1841
359 1676 737 345 624
948 2037 2380 880 2010
1086 36 820 2297 635
496 1704 59 281 2334
1981 323 1318 1731 436
237 2198 418 13 1848
1973 106 142 1864 1155
424 2237 401 1990 2280
254 997 473 1799 102
1122 1894 1095 280 2177
2093 230 1495 1689 307
1872 1053 349 242 619
1965 1636 878 843 2305
1957 1869 2170 1491 1478
675 1521 2047 947 1346
374 405 746 639 2227
804 2296 853 2072 361
372 2259 2306 1867 479
191 558 1609 931 2196
372 1 681 1942 1388
2095 2127 1992
3 461 830
24 1069 1163
1033 822 1634
656 438 1503
721 135 2170
865 1419 1288
964 1453 1297
1536 2086 1100
1778 391 1291
1068 1655 365
410 419 1784
1949 1130 2095
2164 1338 236
1733 82 2038
1895 439 622
599 2338 2171
2047 642 260
868 572 800
1955 224 1329
2372 1818 56
656 594 2271
759 1426 1074
1852 1353 1671.

2. The method of claim 1, wherein the encoding comprises generating $n_{ldpc}-k_{ldpc}$ parity bits ($p_0, p_1, \ldots, p_{n_{ldpc}-k_{ldpc}-1}$) for each frame of the source data sequence, wherein the generation of the parity bits comprises:
   initializing parity bit accumulators for $p_0, p_1, \ldots, p_{n_{ldpc}-k_{ldpc}-1}$ to zero;
   accumulating information bit $i_0$ at parity bit accumulator addresses specified in the first row of the table;
   for the next group of M−1 information bits, $i_y$ (y=1, 2, . . . , M−1), accumulating each information bit at parity bit accumulator addresses $\{x+(y \bmod M)*q\} \bmod (n_{ldpc}-k_{ldpc})$, wherein x denotes an address of a parity bit accumulator corresponding to the information bit $i_0$, and
   wherein q and M are code-dependent constants and k=R*n (where R is the code rate);
   accumulating $i_M$ at parity bit accumulator addresses specified in the second row of the table, and, in a similar manner as for the group of M−1 information bits (above), accumulating each information bit of the next group of M−1 information bits $i_z$, z=(M+1, M+2, . . . , 2M−1) at parity bit accumulator addresses $\{x+(z \bmod M)*q\} \bmod (n_{ldpc}-k_{ldpc})$, wherein x denotes the address of the parity bit accumulator corresponding to the information bit $i_M$ (the entries of the second row of the table);
   in a similar manner, for each subsequent group of M information bits, accumulating the information bits at parity bit addresses based on a next row of the table; and
   after all of the information bits of the frame are accumulated, performing operations according to $p_i = p_i \oplus p_{i-1}$, wherein for i=1, 2, . . . , ($n_{ldpc}-k_{ldpc}-1$), each $p_i$ resulting from the operation for a given i is equal to the parity bit $p_i$.

3. The method of claim 2, wherein, for a given LDPC code rate, the q and M values are in accordance with the following table:

| Rate | M | q |
|---|---|---|
| 1/9 | 100 | 64 |
| 2/9 | 100 | 56 |
| 3/9 | 100 | 48 |
| 4/9 | 100 | 40 |
| 5/9 | 100 | 32 |
| 6/9 | 100 | 24. |

4. The method of claim 1, wherein the LDPC code is of a structure that facilitates use of a plurality of parallel engines for decoding the coded signal.

5. The method of claim 1, further comprising:
   modulating the coded LDPC frames according to according to one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK.

6. The method of claim 1, wherein the source data sequence is segmented into a series of baseband frames, and the method further comprises:
   encoding each baseband frame based on a t-error Bose Chaudhuri Hocquenghem (BCH) code, wherein the BCH encoding comprises an outer coding and the LDPC encoding comprises an inner coding.

7. The method of claim 1, further comprising:
   interleaving each coded LDPC frame using a block interleaver, and the output of the interleaving comprises coded FEC frames.

8. An apparatus comprising:
   at least one processor; and
   at least one memory including computer program code for one or more programs,
   the at least one memory and the computer program code configured to, with the at least one processor, cause the apparatus to perform at least the following:
   encoding a source data sequence of information bits based on a predetermined structured parity check matrix of a Low Density Parity Check (LDPC) code, wherein the encoding is performed based on frames of the source data sequence, each frame being of a length of $k_{ldpc}$ information bits ($i_0, i_1, \ldots, i_{k_{ldpc}-1}$), and the output of the encoding comprises coded LDPC frames each being $n_{ldpc}$ coded bits in length, and
wherein the structured parity check matrix is represented by tabular information of a format wherein each row represents occurrences of one values within a respective column of the parity check matrix, and the columns of the parity check matrix are derived according to a predetermined operation based on the respective rows of the tabular information, and wherein the tabular information comprises a one of Tables 8a through 8f (below);

TABLE 8a

Address of Parity Bit Accumulators
(Rate 1/9, N = 7200)

481 2296 2997 3471 6042 1906 3776 661 6132
1538 4273 361 3175 2055 6040 924 6092 3272
25 1855 3580 4140 3368 37 4336 439 594
4192 1604 3152 2402 1146 2580 3629 5341 3498
1631 1029 3401
4541 4945 5399
2937 5709 2532
6273 5770 1519

TABLE 8b

Address of Parity Bit Accumulators
(Rate 2/9, N = 7200)

4557 3588 3053 538 1502 5541 2801
675 4275 1415 216 10 2497 5112
1615 1453 4656 2570 5189 4299 2737
28 4142 2786 1110 2249 4969 3866
1034 2067 2625 1368 3853 4311 4007
4492 466 275 2104 1145 4227 3937
5302 1029 1243 807 884 4743 3812
294 2895 2004 756 2445 3271 1870
4169 1411 3840
4654 3710 2684
3877 2448 3738
4933 3838 4778
484 2753 4431
3080 1024 2275
427 4202 646
4536 2135 2820

TABLE 8c

Address of Parity Bit Accumulators
(Rate 3/9, N = 7200)

1861 1874 3520 3810 1131 4520
4240 667 4548 4529 1593 3641
4334 2781 3360 2119 738 2254
3911 3674 1190 709 4191 3217
117 1009 1614 4367 3312 4406
2338 1288 2963 688 1468 2621
1374 1448 4186 1017 143 3197
4402 3009 4304 4295 984 4217
4238 3832 549 1644 2749 2678
1598 1520 1839 4743 157 1948
4179 1979 1719 1856 4418 2179
1617 1816 3506 4702 3483 4518
511 3674 2538 30 3511 3462
4602 1140 1658 1375 3286 3875
821 3597 4036 457 438 3454
3988 4006 1914 3859 2300 4164
2213 1347 265
2364 3896 1344
1554 3524 2530
4193 166 2314
491 346 940

TABLE 8c-continued

Address of Parity Bit Accumulators
(Rate 3/9, N = 7200)

4276 2940 4680
1556 2300 168
1124 4555 1916

TABLE 8d

Address of Parity Bit Accumulators
(Rate 4/9, N = 7200)

2008 293 3872 167 1594
3813 1424 609 2395 1506
1743 2092 224 713 2779
2637 1184 2116 2442 2654
3216 2706 834 303 715
3660 402 281 2267 2709
2370 196 2745 1440 1641
205 869 969 1602 2455
500 746 473 2083 401
2363 2407 949 3080 2798
2508 3754 1843 2140 3094
3718 3841 1840 1981 2912
2924 3635 3716 1694 1101
89 3706 3127 355 3277
2340 1983 1277 683 3085
2053 1470 1113 137 2126
112 2781 3480 290 3611
3845 2772 3135 1663 3785
3270 1519 1930 2507 1236
3416 3907 3181 3213 2139
2644 2211 1799 158 591
1137 2645 3858 3884 1113
1975 3732 3417 3942 2570
708 2151 2179 2776 2302
566 3070 2455
3982 191 3388
618 2748 318
3871 1898 456
3688 1818 1665
2785 768 79
2568 3851 2966
3086 1531 3230

TABLE 8e

Address of Parity Bit Accumulators
(Rate 5/9, N = 7200)

22 1372 2500 1497 3032
2824 723 2075 3183 3122
1608 713 1500 653 436
19 409 2086 1634 544
51 2956 270 1918 1201
1067 464 175 753 2110
2978 1416 102 2352 485
1446 1846 1934 939 2781
777 1330 2608 456 766
2861 228 1863 1248 2525
2606 453 2538 2844 1437
1044 1177 1047 98 2259
3128 193 2673 15 311
874 3060 78 2231 1979
21 1699 2487 712 1678
1802 3143 2051 3017 1052
205 3166 787 66 3077
2194 2314 3034 2344 1311
432 1679 1866 359 2476
807 817 534 3090 317
2916 724 2905 1484 2623
2697 373 901 1853 2019
1766 2373 1178 214 3089
1658 2786 1976 896 3199
737 1301 2300

TABLE 8e-continued

Address of Parity Bit Accumulators
(Rate 5/9, N = 7200)

1761 3195 476
1202 441 3081
1991 36 3008
2586 13 1120
1796 1883 2712
570 1407 2743
1630 3000 2811
504 1900 2512
2340 847 1718
2477 1798 1667
2356 1232 1411
971 1600 2271
853 1259 2932
629 140 929
321 1323 2508

TABLE 8f

Address of Parity Bit Accumulators
(Rate 6/9, N = 7200)

1748 1999 1640 1186 2169
1524 1385 355 1206 69
306 221 1341 1192 527
878 609 787 438 1841
359 1676 737 345 624
948 2037 2380 880 2010
1086 36 820 2297 635
496 1704 59 281 2334
1981 323 1318 1731 436
237 2198 418 13 1848
1973 106 142 1864 1155
424 2237 401 1990 2280
254 997 473 1799 102
1122 1894 1095 280 2177
2093 230 1495 1689 307
1872 1053 349 242 619
1965 1636 878 843 2305
1957 1869 2170 1491 1478
675 1521 2047 947 1346
374 405 746 639 2227
804 2296 853 2072 361
372 2259 2306 1867 479
191 558 1609 931 2196
372 1 681 1942 1388
2095 2127 1992
3 461 830
24 1069 1163
1033 822 1634
656 438 1503
721 135 2170
865 1419 1288
964 1453 1297
1536 2086 1100
1778 391 1291
1068 1655 365
410 419 1784
1949 1130 2095
2164 1338 236
1733 82 2038
1895 439 622
599 2338 2171
2047 642 260
868 572 800
1955 224 1329
2372 1818 56
656 594 2271
759 1426 1074
1852 1353 1671.

9. The apparatus of claim 8, wherein the encoding comprises generating $n_{ldpc}-k_{ldpc}$ parity bits $(p_0, p_1, \ldots, p_{n_{ldpc}-k_{ldpc}-1})$ for each frame of the source data sequence, wherein the generation of the parity bits comprises:

initializing parity bit accumulators for $p_0, p1, \ldots, p_{n_{ldpc}-k_{ldpc}-1}$ to zero;

accumulating information bit $i_0$ at parity bit accumulator addresses specified in the first row of the table;

for the next group of M−1 information bits, $i_y$, (y=1, 2, ..., M−1), accumulating each information bit at parity bit accumulator addresses $\{x+(y \bmod M)*q\} \bmod (n_{ldpc}-k_{ldpc})$, wherein x denotes an address of a parity bit accumulator corresponding to the information bit $i_0$, and wherein q and M are code-dependent constants and k=R*n (where R is the code rate);

accumulating $i_M$ at parity bit accumulator addresses specified in the second row of the table, and, in a similar manner as for the group of M−1 information bits (above), accumulating each information bit of the next group of M−1 information bits $i_z$, z=(M+1, M+2, ..., 2M−1) at parity bit accumulator addresses $\{x+(z \bmod M)*q\} \bmod (n_{ldpc}-k_{ldpc})$, wherein x denotes the address of the parity bit accumulator corresponding to the information bit $i_M$ (the entries of the second row of the table);

in a similar manner, for each subsequent group of M information bits, accumulating the information bits at parity bit addresses based on a next row of the table; and after all of the information bits of the frame are accumulated, performing operations according to $p_i = p_i \oplus p_{i-1}$, wherein for i=1, 2, ..., $(n_{ldpc}-k_{ldpc}-1)$, each $p_i$ resulting from the operation for a given i is equal to the parity bit $p_i$.

10. The apparatus of claim 9, wherein, for a given LDPC code rate, the q and M values are in accordance with the following table:

| Rate | M | q |
|---|---|---|
| 1/9 | 100 | 64 |
| 2/9 | 100 | 56 |
| 3/9 | 100 | 48 |
| 4/9 | 100 | 40 |
| 5/9 | 100 | 32 |
| 6/9 | 100 | 24. |

11. The apparatus of claim 8, wherein the LDPC code is of a structure that facilitates use of a plurality of parallel engines for decoding the coded signal.

12. The apparatus of claim 8, wherein the apparatus is further caused to perform:

modulating the coded LDPC frames according to according to one of the following modulation types: BPSK (Binary Phase Shift Keying), π/2 BPSK, OQPSK (Offset Quadrature Phase Shift Keying), QPSK (Quadrature Phase Shift Keying), 8-PSK (Phase Shift Keying), 16-APSK (Amplitude Phase Shift Keying), 32-APSK, 64-APSK and 256-APSK.

13. The apparatus of claim 8, wherein the source data sequence is segmented into a series of baseband frames, and the apparatus is further caused to perform:

encoding each baseband frame based on a t-error Bose Chaudhuri Hocquenghem (BCH) code, wherein the BCH encoding comprises an outer coding and the LDPC encoding comprises an inner coding.

14. The apparatus of claim 8, wherein the apparatus is further caused to perform:

interleaving each coded LDPC frame using a block interleaver, and the output of the interleaving comprises coded FEC frames.

* * * * *